(12) United States Patent
Ichikawa

(10) Patent No.: US 6,259,336 B1
(45) Date of Patent: Jul. 10, 2001

(54) SURFACE ACOUSTIC WAVE FILTER DEVICE

(75) Inventor: Satoshi Ichikawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/321,116

(22) Filed: May 27, 1999

(30) Foreign Application Priority Data

May 27, 1998 (JP) .................................................. 10-146111

(51) Int. Cl.[7] ...................................................... H03H 9/64
(52) U.S. Cl. ...................... 333/193; 333/195; 310/313 B; 310/313 D
(58) Field of Search ..................................... 333/193–196; 310/313 R, 313 B, 313 C, 313 D

(56) References Cited

U.S. PATENT DOCUMENTS

| | | | |
|---|---|---|---|
| 3,675,054 | * | 7/1972 | Jones et al. ...................... 310/313 B |
| 3,792,381 | * | 2/1974 | Bristol ................................... 333/193 |
| 4,223,284 | * | 9/1980 | Inoue et al. ...................... 333/196 X |
| 5,666,091 | * | 9/1997 | Hikita et al. .......................... 333/193 |
| 5,844,453 | * | 12/1998 | Matsui et al. ......................... 333/193 |
| 5,986,524 | * | 11/1999 | Shimoe ............................ 333/196 X |
| 5,990,762 | * | 11/1999 | Nakamura et al. .................. 333/195 |

FOREIGN PATENT DOCUMENTS 9-246901 9/1997 (JP) .
10-65491 * 3/1998 (JP) .

* cited by examiner

*Primary Examiner*—Robert Pascal
*Assistant Examiner*—Barbara Summons
(74) *Attorney, Agent, or Firm*—Oblon, Spivak, McClelland, Maier & Neustadt, P.C.

(57) ABSTRACT

A resonant surface acoustic wave filter device comprises an inter-digital transducer that has a first electrode area that excites a surface acoustic wave and a second electrode area that excites a surface acoustic wave of inverted phase with respect to that excited in the first electrode area, and grating reflectors. By selecting appropriately a ratio of numbers of electrode pairs and a pitch of electrodes of the first area and the second area, band pass characteristics and impedance characteristics of the filter devices can be controlled.

19 Claims, 40 Drawing Sheets

101c

SURFACE ACOUSTIC WAVE FILTER DEVICE

BACKGROUND OF THE INVENTION

1. Field of the Invention

The present invention relates to a surface acoustic wave filter device that is employed for example in a mobile communication instrument and so on such as a cellular-phone. Further, the present invention relates to, in particular, a resonant surface acoustic wave filter device that is provided with an inter-digital transducer (IDT) and reflectors. Still further, the present invention relates to a structure of the IDT in a resonant surface acoustic wave filter device that comprises the IDT and the reflectors.

2. Description of the Related Art

Recently, surface acoustic wave filter devices, being small in size, light in weight, highly reliable and excellent in signal attenuation characteristics outside a pass band, are used in large part in the field of mobile communication. In particular, resonant filter devices that utilize the resonance characteristics of surface acoustic wave can be made small in size, and are capable of producing the resonant filter devices for VHF band and UHF band and further excellent in their filter characteristics. Therefore, they are in the mainstream of the surface acoustic wave filter device technology for mobile communication.

The resonant surface acoustic wave filter device employs a surface acoustic wave resonant element such as illustrated schematically in FIG. 40. The surface acoustic wave resonant filter device comprises IDTs and grating reflectors (GRs) formed on a piezoelectric substrate, and in the device, two grating reflectors disposed an appropriate distance apart form a standing wave resonator of the surface acoustic wave. And IDTs are disposed between the two grating reflectors so as to couple well with the standing wave.

Accompanying further progress of communication instruments for such as vehicular communication, still higher characteristics are demanded for the surface acoustic wave filter devices that are used for such communication instruments. Lower loss in a pass band frequency range and in broader frequency ranges, larger attenuation outside a pass band and excellent cut-off characteristics outside the pass band are desired as frequency characteristics of the surface acoustic wave filter devices.

In resonant surface acoustic wave filter devices, surface acoustic wave reflections by IDT electrode fingers are positively utilized in addition to the reflections due to the GRs. An existing IDT comprises solid electrodes in which polarity of the electrode fingers alternates every adjacent electrode finger. Accordingly, characteristics of the resonant surface acoustic wave filter device are determined by a number of the IDT fingers and GRs, a pitch and a thickness thereof and so on.

However, in an existing method in which the characteristics of the filter are obtained by selecting a number, a pitch and a thickness of IDT fingers and GR, there are restrictions due to a chip size and a limitation in the photo-etching process. Further, in the existing method, the impedance of the filter device varies with the change of these parameters, although it is preferable to have the impedance matching between the filter device and an external circuit connected to the filter device. Thus, there is a problem that a resonant surface acoustic wave filter device having desired characteristics is difficult to be obtained.

In addition, an existing surface acoustic wave filter device having steep cut off characteristics can be constituted in multi-stage. In this case, the filter devices of multi-stage are tuned by use of an external circuit element such as a coil or a capacitor, or tuning elements disposed between filter elements so as to make susceptance components of the filter devices of multi-stage small and favorably zero or flat with respect to frequency dependence to obtain preferable filter device characteristics. There are further problems such that the addition of these external tuning elements makes the external circuit complicated when the filter device is employed and makes the filter device itself large.

Furthermore, a surface acoustic wave filter device of the type to which the present invention relates shows improved filter cut off characteristics in which an IDT of the filter device comprises electrode fingers having a different finger pitch or width from the pitch or width for other ordinary electrode fingers. However, in order to provide surface acoustic wave filters which satisfy recent demands, further improvements on filter cut off characteristics are desired.

SUMMARY OF THE INVENTION

To solve above mentioned problems, this invention provides a resonant surface acoustic wave filter device. An object of the present invention is to obtain a surface acoustic wave filter device having desirable frequency characteristics. Another object of the present invention is to provide a surface acoustic wave filter device in which impedance matching can be maintained when the surface acoustic wave filter device characteristics are varied.

Another object of the present invention is to provide a surface acoustic filter device having low loss in a pass band, having excellent attenuation characteristics outside of the pass band and being capable of responding flexibly to complicated system requirements.

In the first aspect of the present invention, a resonant surface acoustic wave filter device comprises a piezoelectric substrate, an IDT having a first electrode area that is formed on the piezoelectric substrate and excites a first surface acoustic wave and a second electrode area that excites a second surface acoustic wave of inverted phase with respect to the first surface acoustic wave excited at the first electrode area, and GRs formed on the piezoelectric substrate disposed at both sides of the IDT along the direction of propagation of the surface acoustic waves that are excited by the IDT.

Here, an IDT is for example a pair of comb shaped metal thin film electrodes having electrode fingers arranged such that each electrode finger having one polarity is placed in a space between electrode fingers having the other polarity. In a structure of the resonant surface acoustic wave filter device, the GRs made of metallic thin film are disposed on both sides of the IDT so as to put the IDT between the GRs along the direction of propagation of the surface acoustic waves that are excited by the IDT.

The resonant surface acoustic wave filter device of the present invention can have a plurality of IDTs placed between the reflectors. Further, the resonant surface acoustic wave filter device of the present invention may comprise resonant surface acoustic wave filter devices having above mentioned IDTs connected in two stages or more.

A pitch of the electrode fingers array in the second electrode area of the IDT of the resonant surface acoustic wave filter device can be set approximately equal to that of the electrode fingers array in the first electrode area, and thereby, the first surface acoustic wave in frequency region of a pass band of the filter device can be partially counteracted by the second surface acoustic wave of inverted phase to make pass band frequency characteristics of the filter device flat.

In addition, the pitch of the electrode fingers array in the second electrode area of the IDT can be set larger than that of the electrode fingers array of the first electrode area, and thereby, the first surface acoustic wave at low frequency outside of the filter device pass band is counteracted by the second surface acoustic wave of inverted phase with respect to the first surface acoustic wave to increase attenuation at the low frequency outside of the filter device pass band.

Further, the pitch of the electrode fingers array in the second electrode area of the IDT can be set smaller than that of the electrode fingers array of the first electrode area, thereby, the first surface acoustic wave at high frequency outside of the filter device pass band is counteracted by the second surface acoustic wave of inverted phase with respect to the first surface acoustic wave to increase attenuation at the high frequency outside of the filter device pass band.

Accordingly, the ratio Pb/Pa, wherein Pb is the pitch of the array of the electrode fingers in the second electrode area and Pa is the pitch of the array of the electrode fingers in the first electrode area of the IDT of the resonant surface acoustic wave filter device of the present invention, is preferable to be 0.95 or more and 1.05 or less.

In a second aspect of the present invention, the resonant surface acoustic wave filter device comprises a plurality of resonant surface acoustic wave filters colmecting, at least one of the plurality of resonant surface acoustic wave filters having an IDT that comprises a first electrode area that excites a first surface acoustic wave and a second electrode area that excites a second surface acoustic wave of inverted phase with respect to the first surface acoustic wave that is excited in the first electrode area and reflectors formed at both sides of the GRs along the propagation direction of the surface acoustic waves excited by the IDT.

In the resonant surface acoustic wave filter device of the present invention, a pitch of the electrode fingers array in the second electrode area of the IDT can be set approximately equal to that of the electrode fingers array in the first electrode area. Thereby, the first surface acoustic wave in a frequency region of a pass band of the filter is partially counteracted by the second surface acoustic wave of inverted phase with respect to the first surface acoustic wave to make frequency characteristics of the pass band of the filter device flat.

In addition, the pitch of the array of the electrode fingers in the second electrode area of the IDT can be set larger than that of the array of the electrode fingers of the first electrode area. Thereby, the first surface acoustic wave outside the low frequency outside of the filter device pass band is counteracted by the second surface acoustic wave of inverted phase with respect to the first surface acoustic wave to increase attenuation at low frequency outside of the filter device pass band.

Further the pitch of the array of the electrode fingers in the second electrode area of the IDT can be set smaller than that of the array of the electrode fingers of the first electrode area. Thereby, the first surface acoustic wave at the high frequency outside of the filter device pass band is canceled out by the second surface acoustic wave of inverted phase with respect to the first surface acoustic wave to increase attenuation at the high frequency outside of the filter device pass band.

Here, the ratio Pb/Pa, wherein Pb is the pitch of the array of the electrode fingers in the second electrode area and Pa is the pitch of the array of the electrode fingers in the first electrode area of the IDT of the resonant surface acoustic wave filter device of the present invention, is preferable to be 0.90 or more and 1.1 or less.

In the surface acoustic wave filter device of the present invention, among the IDTs the resonant filter device comprises, at least one IDT has a plurality of areas including an area where excited surface acoustic waves are in a normal phase and an area where excited surface acoustic waves are in inverted phase with respect to the normal phase. In the surface acoustic wave filter device having the IDT possessing such plurality of areas, the surface acoustic waves in the normal phase are counteracted partially by the surface acoustic wave in the inverted phase, the pass band frequency characteristics can be made flat and attenuation characteristics outside the pass band can be made steep.

That is, the pitch of the array of the electrode fingers in the second electrode area is set approximately equal to that of the array of the electrode fingers of the first area so as to excite surface acoustic waves having frequencies in the pass band of the filter device. Thereby the pass band frequency characteristics of the filter device can be made flat.

In addition, the pitch of the array of the electrode fingers in the second electrode area is set larger than that of the array of the electrode fingers of the first electrode area so as to excite surface acoustic waves having lower frequencies outside of the filter device pass band. Thereby the attenuation characteristics at low frequency outside of the filter device pass band can be increased.

Further, the pitch of the array of the electrode fingers in the second electrode area is set smaller than that of the array of the electrode fingers of the first area so as to excite surface acoustic waves having higher frequencies outside of the filter device pass band. Thereby the attenuation at high frequency outside of the filter device pass band can be increased.

In the third aspect of the present invention, the resonant surface acoustic wave filter device comprises a surface acoustic wave filter comprising an IDT that has a first area where polarity alternates every adjacent electrode finger and a second area including an alternate arrangement of a first set of plural electrode fingers having a polarity and a second set of electrode fingers possessing at least one member having the other polarity. A ratio Pb/Pa of the electrode fingers array pitch Pb in the second area to that in the first area Pa is 0.95 or more and 1.05 or less.

Further, the resonant surface acoustic wave filter device of the present invention can comprise a plurality of connected resonant acoustic wave filters that have IDTs, wherein at least one of the resonant filters among the resonant filters has an IDT that has the first area and the second area.

In the present invention, the ratio between the first area and the second area may be varied according to the demanded characteristics.

In the surface acoustic wave filter device, a plurality of sets of such IDTs and reflectors may be formed on a piezoelectric substrate. Further, the IDT of at least one set among the plurality of sets formed on the same piezoelectric substrate may comprise the first area and the second area. The first area and the second area may be adjacent each other, or may intervene between each other.

In the resonant surface acoustic wave filter device, the first area may be solid electrodes, and the second area may be split electrodes.

Here, the solid electrodes comprise a pair of electrodes having electrode fingers that are placed so that the polarity of the electrode fingers alternates one by one when a electric signal is applied. Further, the split electrodes comprise a pair of electrodes having electrode fingers in pairs that are placed so that the polarity of the electrode fingers alternates pair by pair. The width and pitch of the array of the electrode fingers of the split electrode can be made equal to the width and pitch of the array of the electrode fingers constituting the solid electrode by setting the central frequency of the split electrode at approximately one half of the central frequency of the solid electrode. Then, the split electrode works as a reflector for the surface acoustic wave excited by the solid electrode and contributes to lowering the insertion loss of the surface acoustic wave filter device. On the other hand, surface acoustic waves that are excited by the split electrode are canceled out in the split electrode. So, the influence of surface acoustic waves excited by the split electrode upon filter device characteristics can be avoided.

The split electrode works as a reflector to surface acoustic waves having a frequency twice the central frequency of the split electrode fingers. In contrast with existing grating reflectors of which all electrodes have the same polarity and do not have a capacitance, the split electrode has a capacitance between a pair of electrodes fingers since the split electrode comprises electrode finger pairs alternating polarity pair by pair. Therefore, an exciting signal source can be replaced without changing a tuning capacitance of a surface acoustic wave filter when the split electrodes are replaced partially by the solid electrodes. Further, the capacitance of the surface acoustic wave filter can be controlled without changing the exciting signal source when a split electrodes are added co the surface acoustic wave filter that comprises the solid electrodes.

Thus, according to a surface acoustic wave filter device of the present invention, a sophisticated frequency characteristics that the system demands can be flexibly realized without sacrificing the low loss characteristics and small size of the surface acoustic wave filter device.

The second area of the IDT may have a portion having a capacitance between the electrode fingers that are disposed adjacent.

Further, the second area of the IDT may comprise a sequence of two or more of the electrode fingers of the same polarity. In other words the second area of the IDT may comprise two or more of the electrode fingers arranged in sequence which have the same polarity when the electrical signal is applied. For example, the first area of the IDT comprises a first electrode finger connected to have a first polarity and a second electrode finger connected to have a second polarity arranged alternately. And the second area may comprise a periodical arrangement of an even number of electrode fingers consisting of at least one member of the first electrode fingers and three of the second electrode fingers.

That is, a surface acoustic wave filter device of the present invention may comprise a piezoelectric substrate and an IDT formed on the piezoelectric substrate, wherein the IDT has an alternate arrangement of a first area where a first electrode fingers connected to have a first polarity, a second electrode finger connected to have a second polarity, and a second area formed so that the first electrode fingers and the second electrode fingers are disposed periodically with a cycle unit of an odd number electrode fingers consisting of at least one of the first electrode fingers and at least two of the second electrode fingers.

Further, the resonant surface acoustic wave filter device may comprise a single or a plurality of IDTs that has mutually intersecting comb shaped electrodes made of metallic thin film formed on the piezoelectric substrate, and GRs that are disposed to put the IDT between GRs along the direction of propagation of the surface acoustic wave excited by the IDT.

There, all the electrode fingers that the IDT comprises are electrodes (hereinafter refer to as solid electrodes) that are disposed with a width and a pitch of a quarter wavelength of the surface acoustic wave excited by the IDT. At least one IDT of the IDTs may have a first area where the polarity of the electrode fingers that the IDT comprises has a unit cycle by two thereof, and a second area where an even number of four or more of the electrode fingers has a unit cycle.

Further, the width and the pitch of the electrode fingers constituting the IDT may be a quarter wavelength of the surface acoustic wave that the IDT excites.

In addition, the IDT may comprise a first area and a second area in which the phase of the surface acoustic wave excited in the first area and that of the surface acoustic wave excited in the second area are in phase. Further, the IDT may comprise a first area and a second area in which the phase of the surface acoustic wave excited in the first area and that of the surface acoustic wave excited in the second area are in inverted phase.

Further, the electrode fingers that the IDT comprises when the pitch of the array in the first area is p1 and the pitch of the array of the second area is p2, may satisfy the following relationship.

$$p1 \times 0.95 \leq p2 \leq p1 \times 1.05.$$

The surface acoustic wave filter device may comprise GRs at both sides of the IDT along the propagation direction of the surface acoustic waves that the IDT excites. That is, the surface acoustic wave filter device of the present invention comprises, at least one IDT having a first area where a unit cycle of polarity comprises two electrode fingers and a second area where a unit cycle of polarity comprises an even number of four or more electrode fingers. Thereby sophisticated frequency characteristics can be realized without changing the number of the electrode fingers while suppressing impedance variation at minimum level.

According to the present invention, at least one of the IDTs of the surface acoustic wave filter device may comprise a first area in which a unit cycle of polarity have two electrode fingers, and a second area in which a unit cycle of polarity has an even number of four or more electrode fingers.

The solid electrodes, since the electrodes themselves reflect the surface acoustic wave, are a desirable electrode structure for realization of low loss. Since the present invention has a second area where a unit cycle of polarity comprises an even number of four or more of the electrode fingers in a unit cycle of polarity, there occurs a portion where the electrode fingers of the same polarity are arranged when an electric signal is applied This portion, since the surface acoustic wave is not excited in this portion, works only as a reflector to the surface acoustic wave excited in the first area comprising alternate arrangement of polarized electrode fingers having one polarity and the other polarity.

That is, as described above, the second area of the IDT works as a reflector to the surface acoustic wave of frequency corresponding to the pitch of the array of the electrode fingers that this area comprises. In contrast to an existing reflector of which electrode fingers are all the same polarity, the second area of the IDT working as the reflector comprises electrode fingers of different polarities. Accordingly, these have a capacitance and an exciting source that an existing grating reflector cannot have between these electrode fingers of different polarities.

Further, a part of an existing IDT where a unit cycle comprises two solid electrodes may be replaced by the second area where a unit cycle comprises an even number of four or more of the electrode fingers. Thereby, a capacitance occurs In the thickness direction of the piezoelectric substrate, accordingly, without changing the number of the source exciting the surface acoustic wave filter device. The capacitance of the surface acoustic wave filter device can be varied.

In the surface acoustic wave filter device of the present invention, at least one of the IDTs can have a first area consisting of a solid electrode where a unit cycle of polarity comprises two electrode fingers and a second area comprising a solid electrode where a unit cycle of polarity comprises an odd number of three or more of the electrode fingers. Thereby, the capacitance can be added to the first area of the IDT. Therefore, without changing the aperture length, the impedance characteristics of the surface acoustic wave filter device can be controlled. Further, a sophisticated frequency characteristics can be realized, without changing a number of the electrode fingers, while suppressing variation of an impedance upon controlling characteristics of the surface acoustic wave filter device to a minimum.

According to the surface acoustic wave filter device of present invention, the IDT has a second area that has a solid electrode where two electrode fingers make a unit cycle of polarity and another solid electrode where an odd number of three or more of the electrode fingers make a unit cycle of polarity. As described above, the solid electrode, since the electrode itself reflects the surface acoustic wave, is a desirable structure for realization of low loss. In such a second area, though two kinds of the surface acoustic waves mutually different 180° in their phases are excited, these surface acoustic waves cancel out each other. As a result, in this second area, the surface acoustic wave is not excited. Therefore, the second area works only as a reflector to the surface acoustic wave (the first surface acoustic wave) excited in the first area of which the unit cycle of the polarity comprises two electrode fingers.

Further, between electrode fingers having a different polarity of the second area where a unit cycle comprises an odd number of three or more electrode fingers, a capacitance is formed. Namely, a part of the second area carries a function as a capacitor element in addition to a function as a reflector that an existing reflector cannot realize. According to the surface acoustic wave filter device of the present invention that has such a constitution, since the IDT has a second area of which the unit cycle of polarity comprises an odd number of three or more of the electrode fingers, the capacitance component that is added to this area is connected parallel to the first area of the IDT. Thereby, without changing the number of pairs or the aperture length of the electrode fingers that the IDT comprises, an impedance can be decreased. This means that in the surface acoustic wave device having the same impedance, the aperture length thereof can be made small, and, the surface acoustic wave device can be made compact. Thereby, the surface acoustic wave device particularly suitable for portable electronic instruments such as vehicular communication devices, portable information terminals or the like can be provided.

DESCRIPTION OF PREFERRED EMBODIMENTS

In the following, the surface acoustic wave filter device of the present invention will be described in more detail.
(Embodiment 1)

Figure 1:
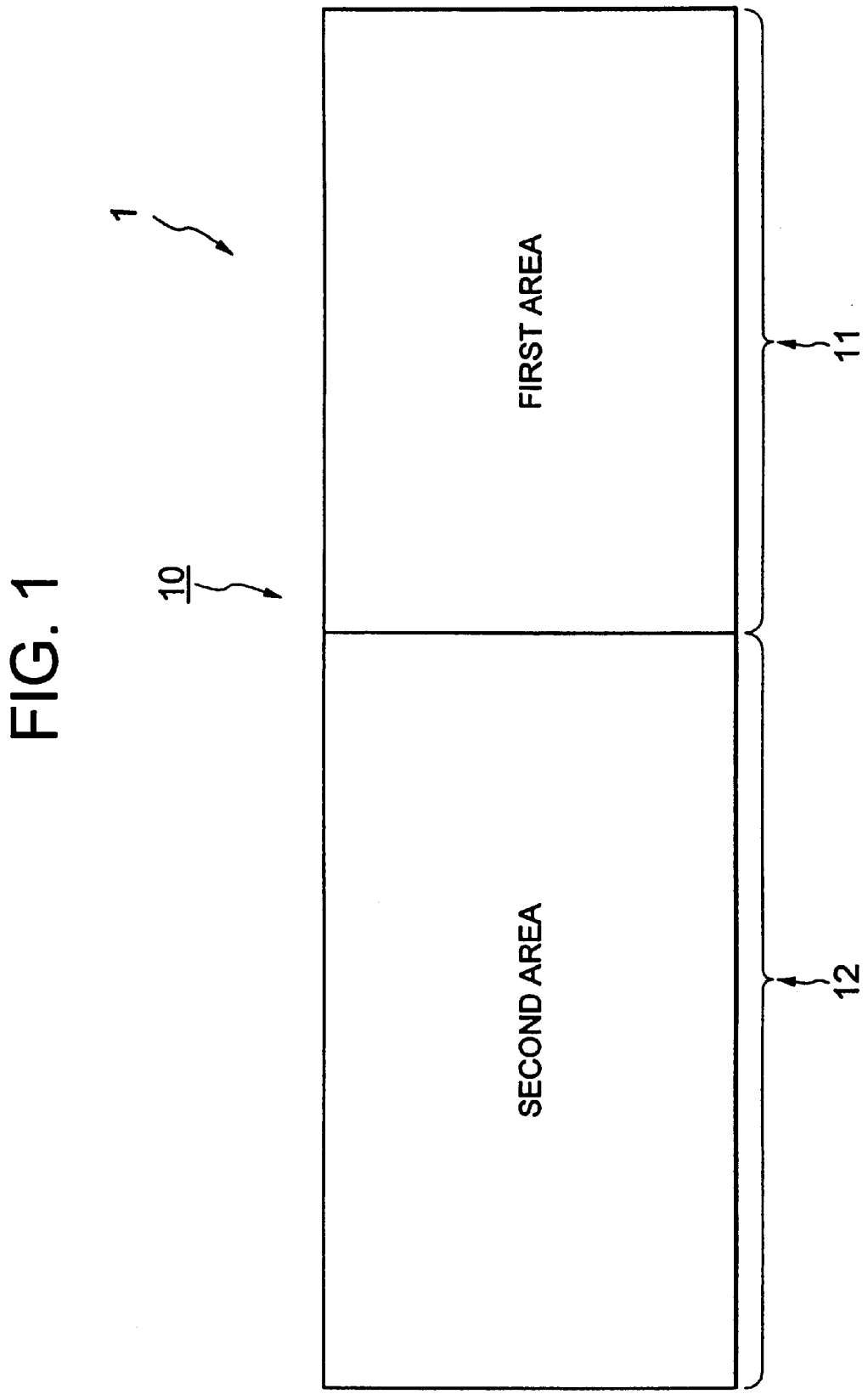
FIG. 1 is a diagram showing schematically a constitution of an IDT of one embodiment of a surface acoustic wave filter device of the present invention.
Figure 2:
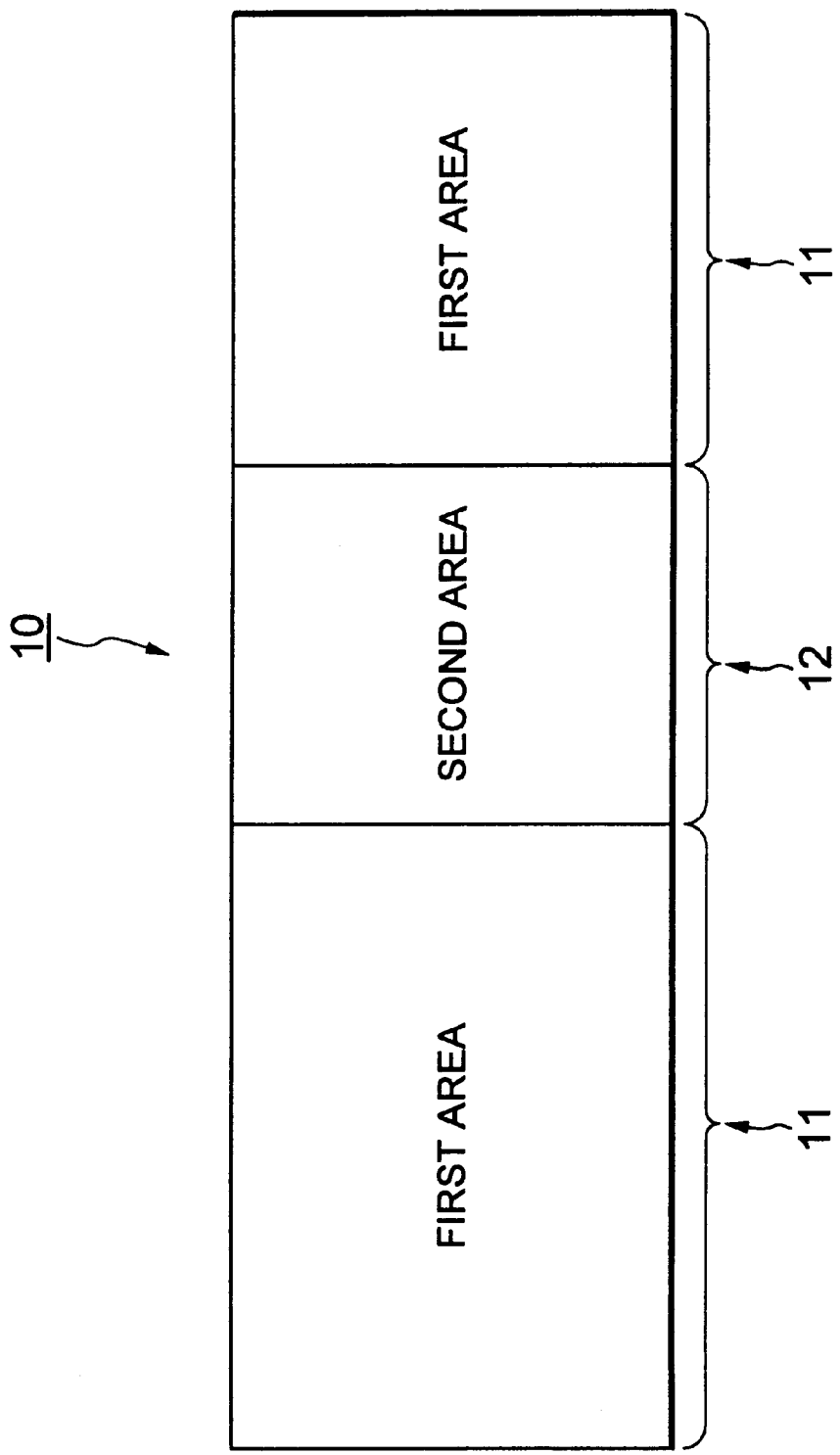
FIG. 2 is a diagram showing schematically a constitution of an IDT of another embodiment of a surface acoustic wave filter device of the present invention.

FIG. 1 and FIG. 2 are schematic diagrams showing constitutions of surface acoustic wave filter devices of the present invention that have IDTs having a first area and a second area.

In these figures, for a piezoelectric substrate 1, for example, quartz, LBO (lithium tetra-borate), $LiNbO_3$, or $LiTaO_3$ can be employed.

In FIG. 1 and FIG. 2, IDTs 10 have, other than a first area 11 that excites a surface acoustic wave of positive phase, a second area 12 that excites a surface acoustic wave of inverted phase. In an example shown in FIG. 1, one IDT comprises one first area 11 of positive phase and one second area 12 of inverted phase. Further, in an example of FIG. 2, one IDT comprises two first areas 11 of positive phase and one second area 12 of inverted phase. Thus, in the IDT 10 of the surface acoustic wave filter device of the present invention, a plurality of the first areas of positive phase 11 or the second areas of inverted phase 12 may be disposed.

In the first area and the second area, only the phases of excited signals are inverted with respect to each other. Accordingly, any one of two areas can be made positive. However, in this invention, the phase of the area in which a signal is more strongly excited than that in the other because of more electrode fingers is designated as positive phase. The IDT area thereof is designated as a first area and the other area of inverted phase is designated as a second area. The difference in phases of the signals excited in the first area and the second area is not necessarily strictly 180°. But it is preferable for the excited signals in the first and second areas to cancel out each other to give steep attenuation of pass characteristics out of a pass band.

Figure 3:
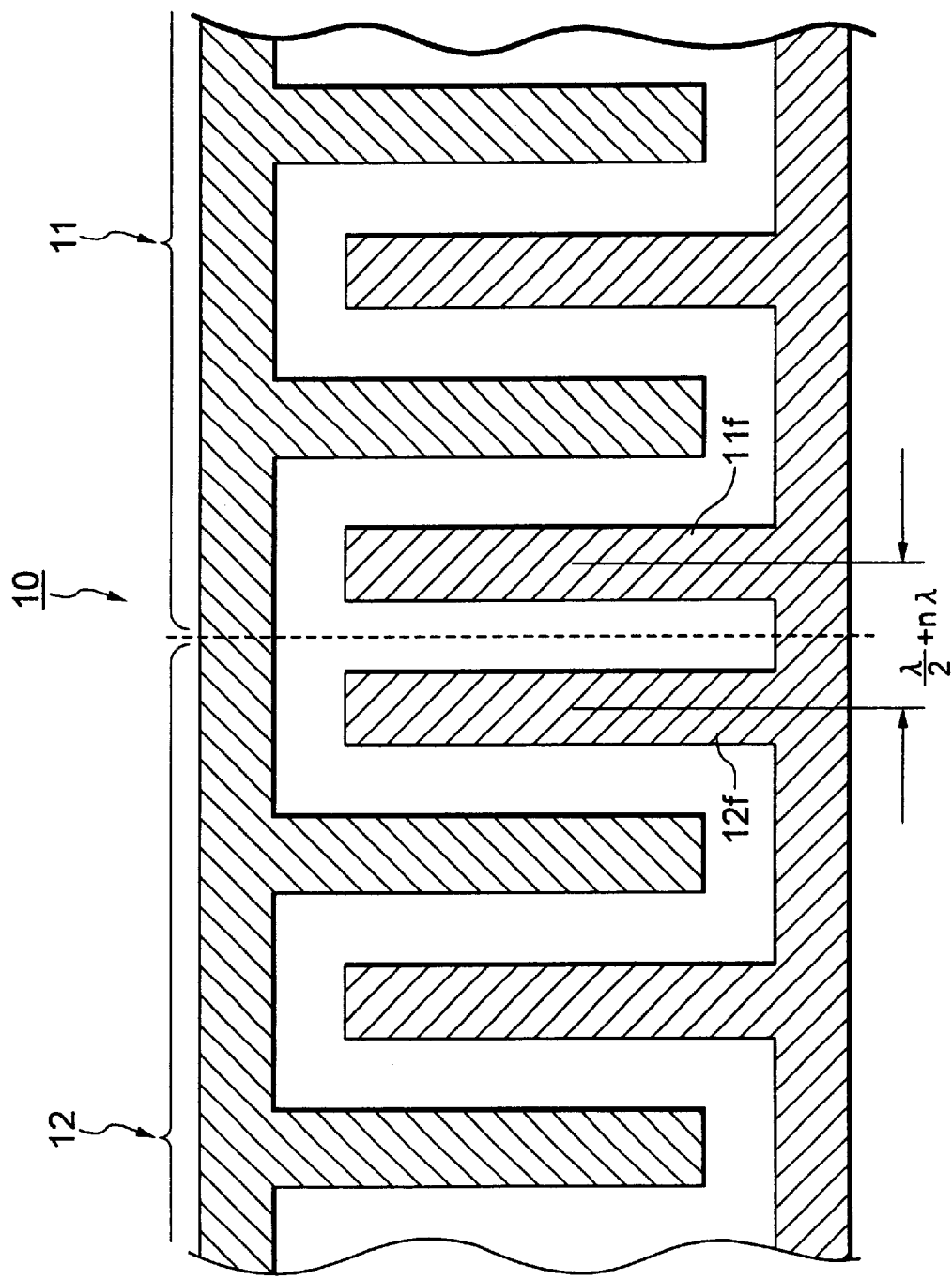
FIG. 3 is a schematic diagram showing a boundary of a first area and a second area of an IDT according to an embodiment of surface acoustic wave filter device of the present invention.

FIG. 3 is a schematic diagram showing an example of a specific constitution of an IDT that has a first area and a second area, which a surface acoustic wave filter device of the present invention comprises.

Between the first area 11 and the second area 12, as illustrated in FIG. 3, there is a spacing of $(\lambda/2)+n\lambda$ (here, n is 0 or natural number) between centers of adjacent electrode finger 11f and electrode finger 12f. The adjacent electrode fingers 11f and 12f are given the same polarity.

Figure 4:
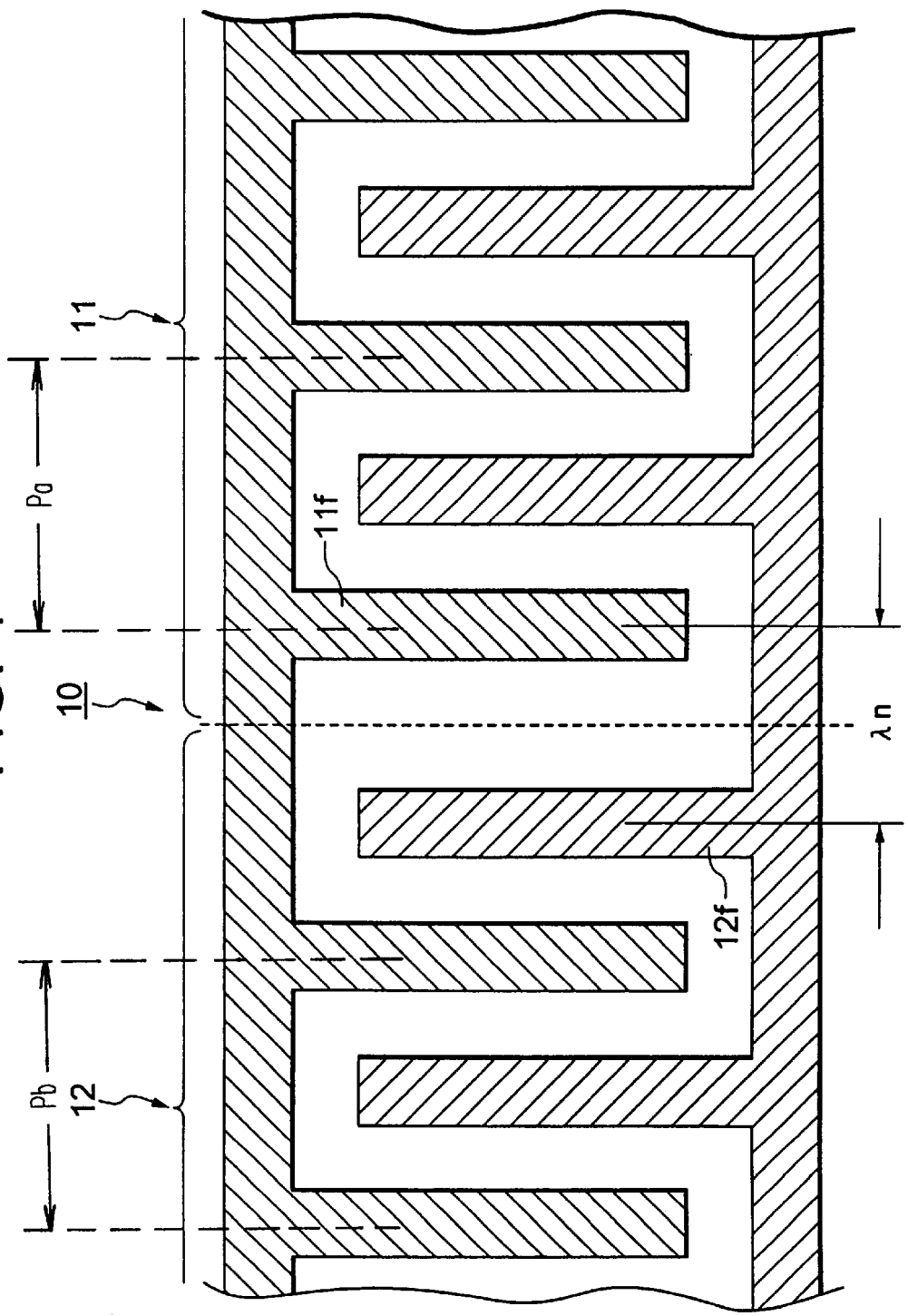
FIG. 4 is a schematic diagram showing another example of a boundary of a first area and a second area of an IDT according to an embodiment of the surface acoustic wave filter device of the present invention.

FIG. 4 is a schematic diagram showing another example of a constitution of an IGT that has a first area and a second area, which a surface acoustic wave filter device of the present invention comprises.

Between the first area 11 and the second area 12, as illustrated in FIG. 4, there is a spacing of $n\lambda$ (here, n is a natural number) between centers of adjacent electrode fingers 11f and 12f. In this portion, a different polarity is given to the adjacent electrode fingers.

Figure 5:
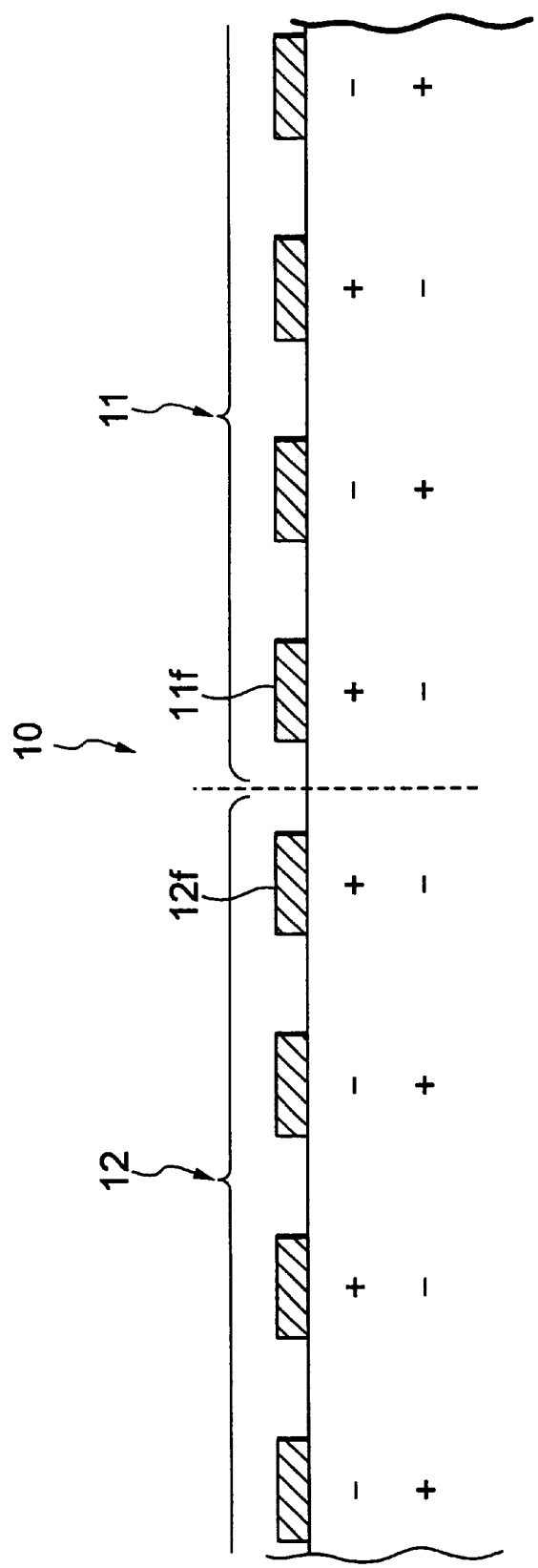
FIG. 5 is a cross section diagram showing schematically the polarity of electrode fingers constituting an IDT of one embodiment of the surface acoustic wave filter device of the present invention illustrated in FIG. 3.

FIG. 5 is a schematic cross section describing the polarity of electrode fingers constituting an IDT 10 of the surface acoustic wave filter device of the present invention illustrated in FIG. 3. In FIG. 5, an edge electrode finger 11f of the first area 11 and an edge electrode finger 12f of the second area that are disposed adjacent are in phase, and the first area 11 and the second area 12 are in inverted phase.

Thus, the IDT of the surface acoustic wave filter device of the present invention comprises a first area 11 and a second area 12 that excite surface acoustic waves of different phases. Accordingly, among the first area 11 and the second area 12, at portions where the number of pairs of electrode fingers are the same, the excitation is canceled out. When the pitches of an array of electrode fingers are the same for the first area 11 and the second area 12, at portions where the number of pairs are the same, the excitation is completely canceled out.

When the pitches of the array of the electrode fingers are different between the first area 11 and the second area 12, the excitation is not completely canceled, but the excitation of the first area and that of the second area mutually cancel according to the intensities corresponding to excitation efficiencies of the IDT. That is, the excitation is counteracted weighted, and thereby the steep attenuation of pass characteristics out of a pass band can be realized.

When the first area 11 and the second area 12 of an IDT comprise a solid electrode, the first area 11 and the second area 12 of the IDT interfere with each other as an exciting source of a surface acoustic wave. However, the IDT electrode fingers in the respective areas are not distinguished of a point that the electrode fingers are reflecting sources for the respective surface acoustic waves.

The IDT having the adjacent electrode fingers of mutually different polarity results in a capacitance. Since the IDT of the present invention is divided into the first area and second area, the capacitance that the IDT has is obtained by connecting in parallel the capacitance in the first area and the capacitance in the second area. In addition, at the boundary of the areas, the electrode fingers of the same polarity are arranged. Accordingly, the difference in the directions of electric flux lines results in different capacitance values. By increasing boundary areas by dividing the second area into several areas, the capacitance can be varied largely. Thus, due to disposition of the IDTs of different phases, in addition to changing the state of excitation of the surface acoustic wave, the capacitance that the IDT has can be varied. Thereby, the characteristics of the resonant surface acoustic wave filter device can be controlled.

(Embodiment 2)

An ST cut quartz is employed as the piezoelectric substrate. A resonant surface acoustic wave filter for 215 MHZ band is made with a structure in which two IDTs having 85 electrode finger pairs each are set between two reflectors having 100 electrodes each. One of the two IDTs has a first area of 70 pairs and a second area of 15 pairs, and the other IDT of the two has the first area only. This resonant surface acoustic wave filter is simulated on a 50 Ω condition.

Figure 6:
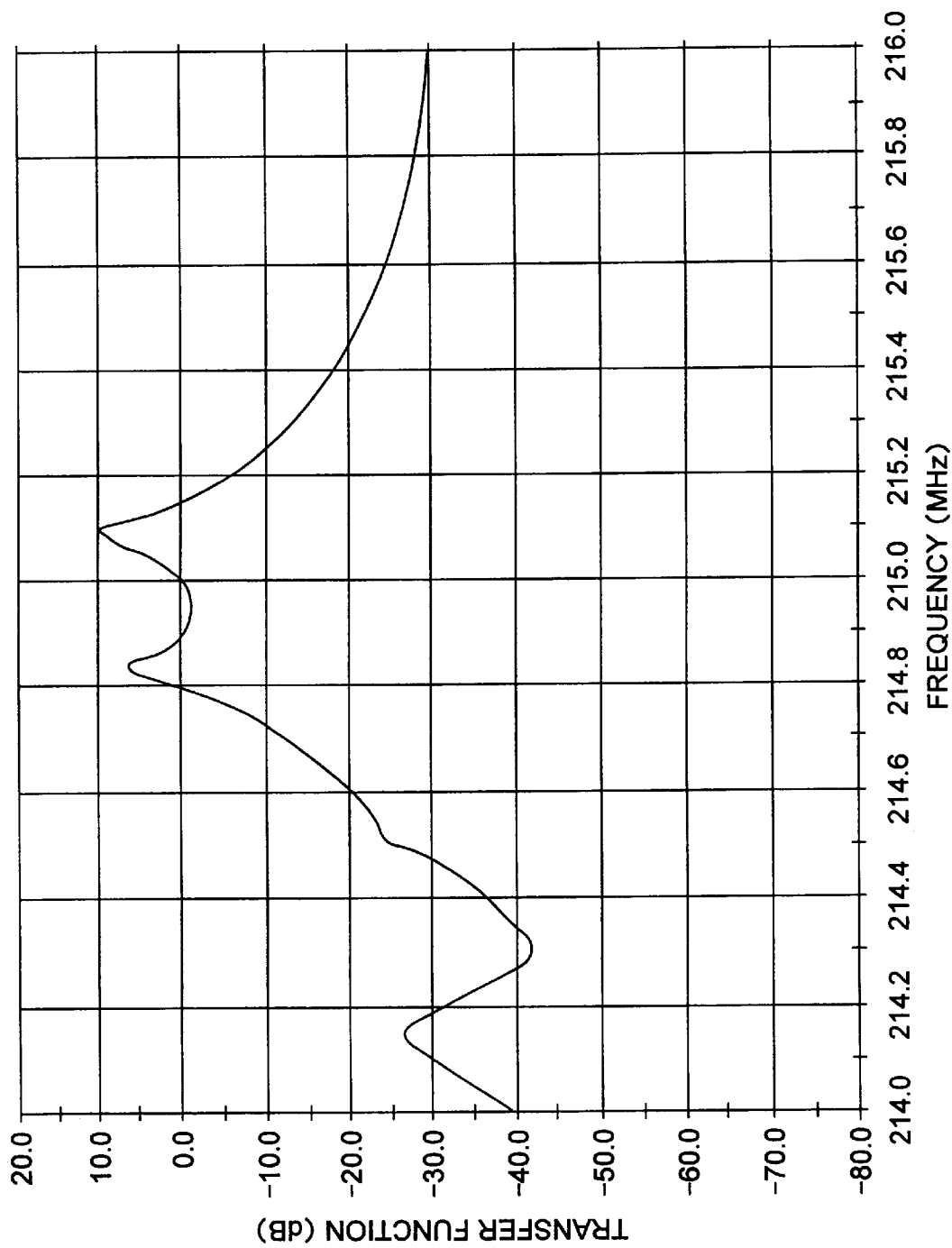
FIG. 6 is a diagram showing the result obtained by simulating, on a 50 Ω condition, band pass characteristics of the surface acoustic wave filter device of one embodiment of the present invention.
Figure 7:
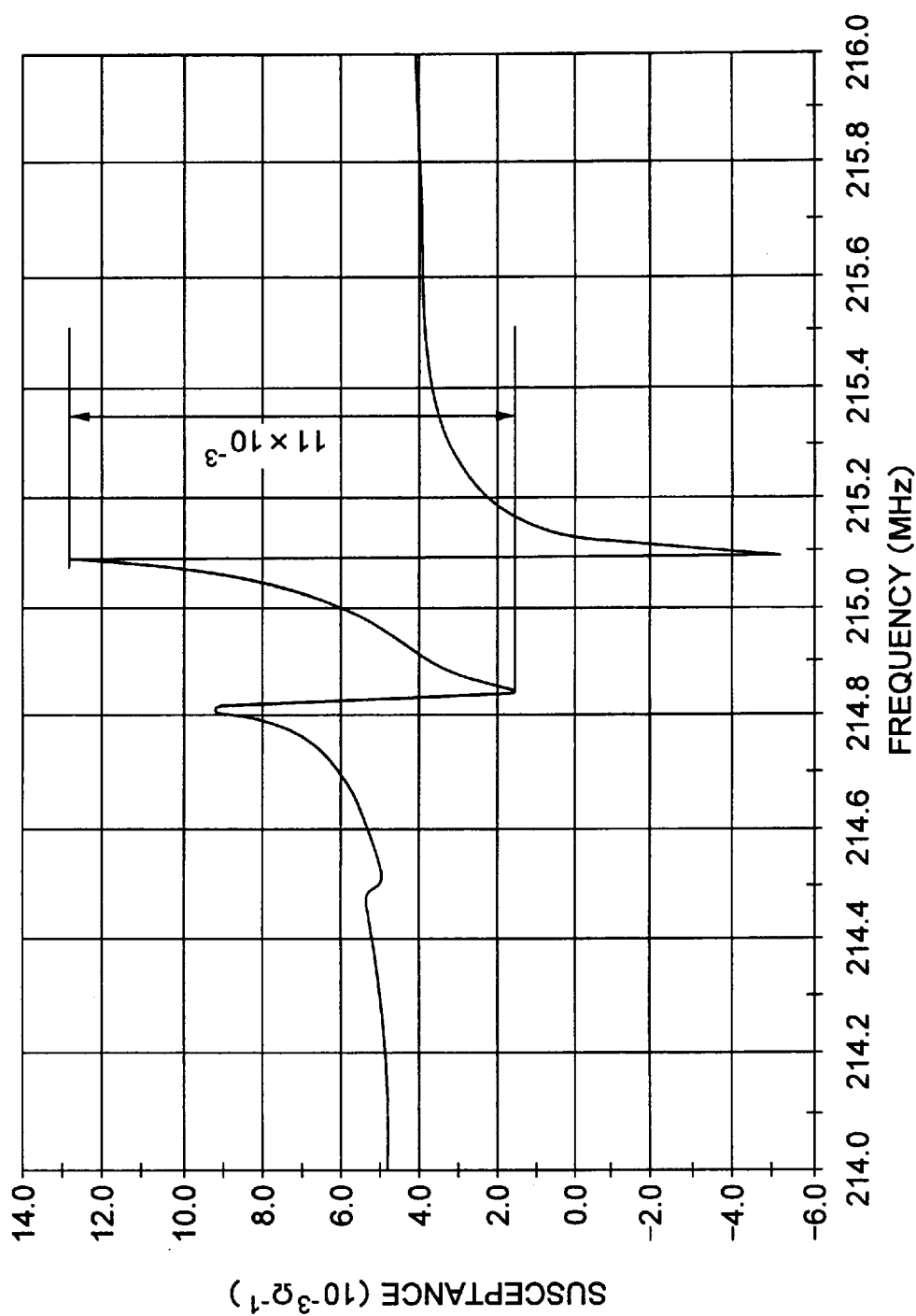
FIG. 7 is a diagram showing the result obtained through simulation, on a 50 Ω condition, of frequency dependence of susceptance of the surface acoustic wave filter device of one embodiment of the present invention.

FIG. 6 is a diagram showing the result of band pass characteristics. Further, FIG. 7 is a diagram showing frequency dependence of susceptance.

(Embodiment 3)

Similar to the embodiment 2, as the piezoelectric substrate of the surface acoustic wave filter device, an ST cut quartz is employed. A resonant surface acoustic wave filter device for 215 MHZ band is made to have a structure in which two IDTs having 85 pairs of electrode fingers are put between two reflectors having 100 electrodes. One IDT of the two has a first area of 65 pairs and a second area of 20 pairs, and the other IDT has the first area only. This resonant surface acoustic wave filter device is simulated on a 50 Ω condition.

Figure 8:
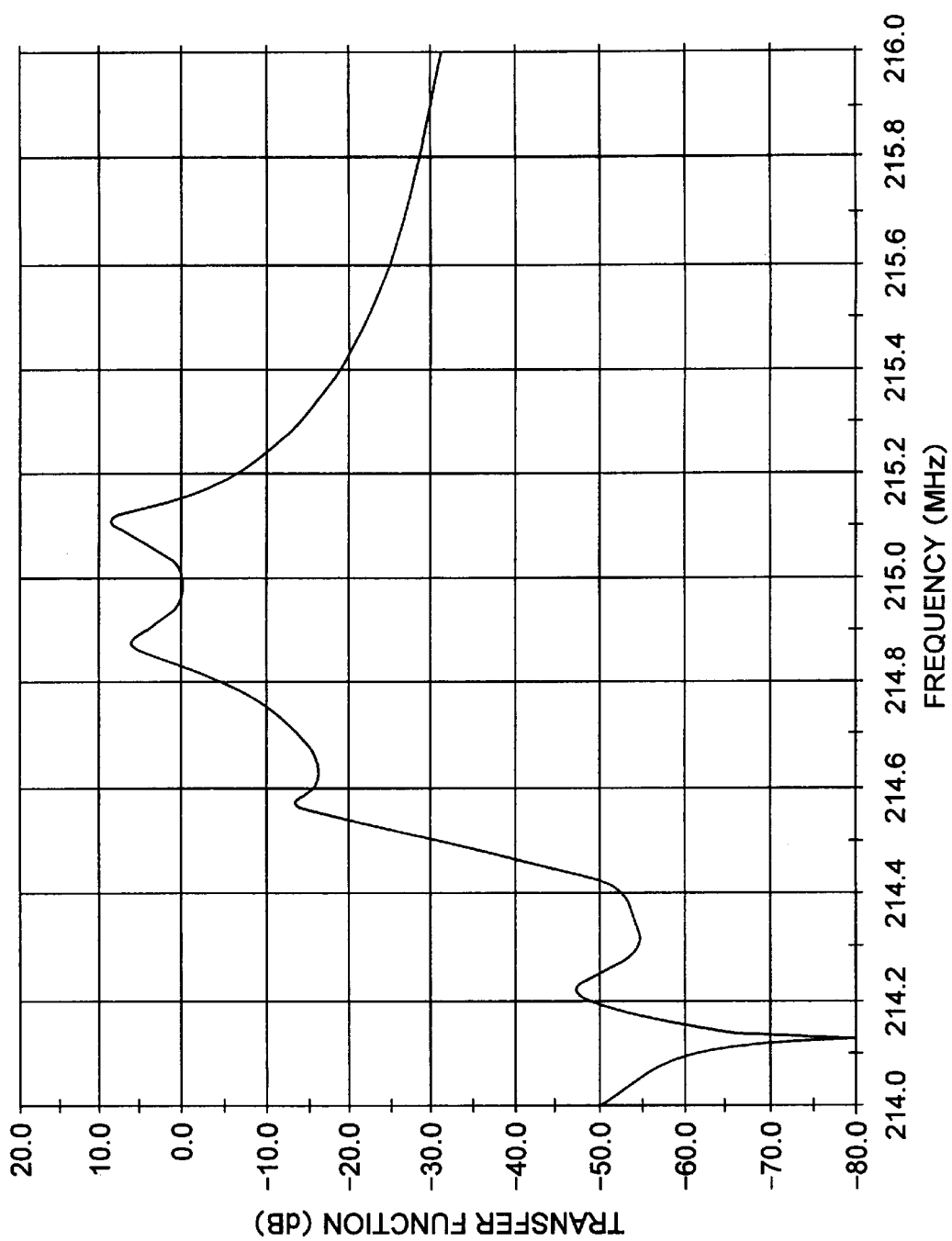
FIG. 8 is a diagram showing the result obtained through simulation, on a 50 Ω condition, of band pass characteristics of the surface acoustic wave filter device of another embodiment of the present invention.
Figure 9:
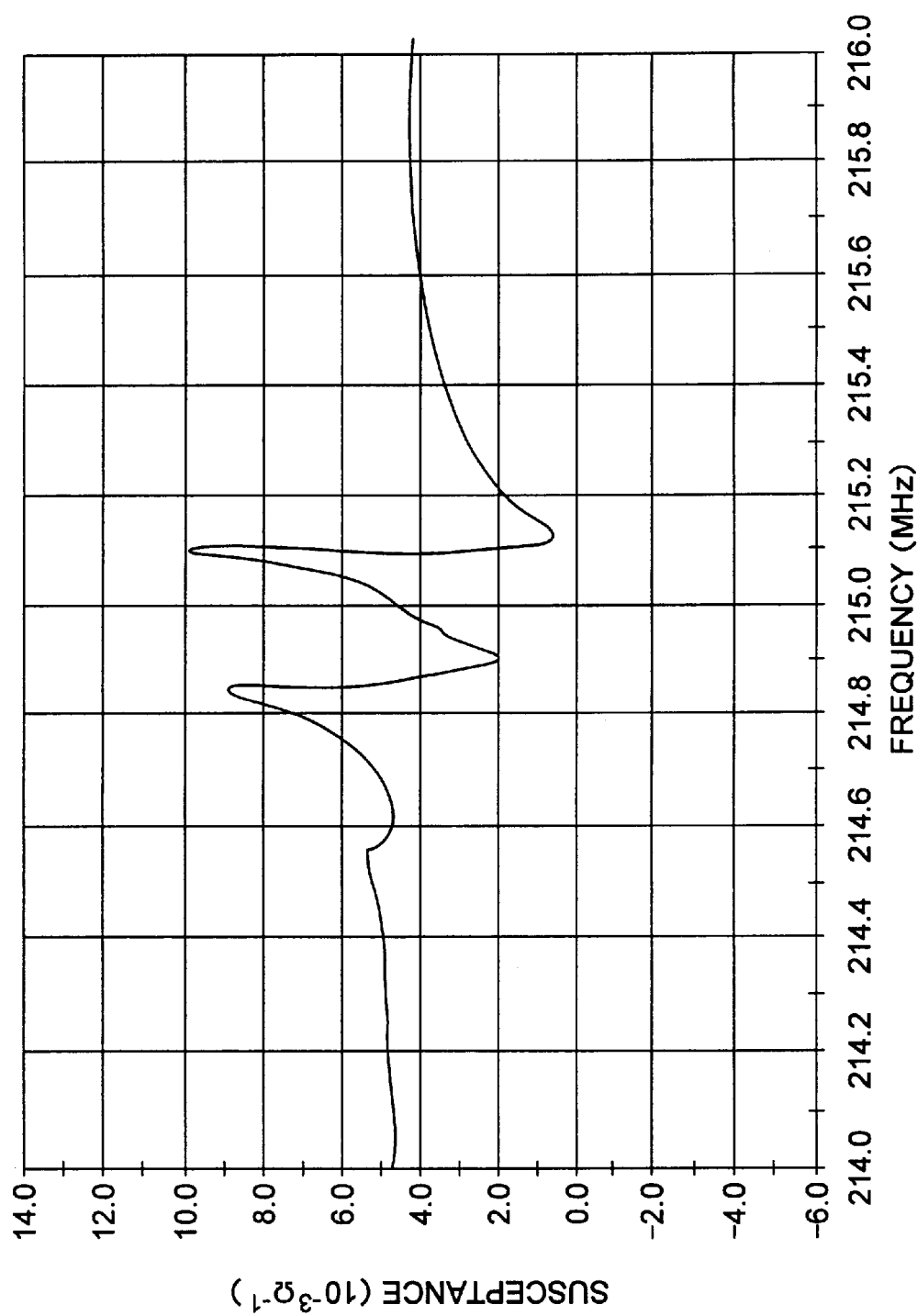
FIG. 9 is a diagram showing the result obtained through simulation, on a 50 Ω condition, of frequency dependence of susceptance of the surface acoustic wave filter device of one embodiment of the present invention.

FIG. 8 is a diagram showing the result of band pass characteristics. Further, FIG. 9 is a diagram showing frequency dependence of susceptance.

(Comparative Example)

Similar to the embodiment 2, as the piezoelectric substrate of the surface acoustic wave filter device, a ST cut quartz is employed. A resonant surface acoustic wave filter device for 215 MHZ band is made to have a structure with two reflectors having 100 electrodes and two IDTs consisting of a first area having 85 pairs of electrode fingers only. This resonant surface acoustic wave filter device is simulated on a 50 Ω condition.

Figure 10:
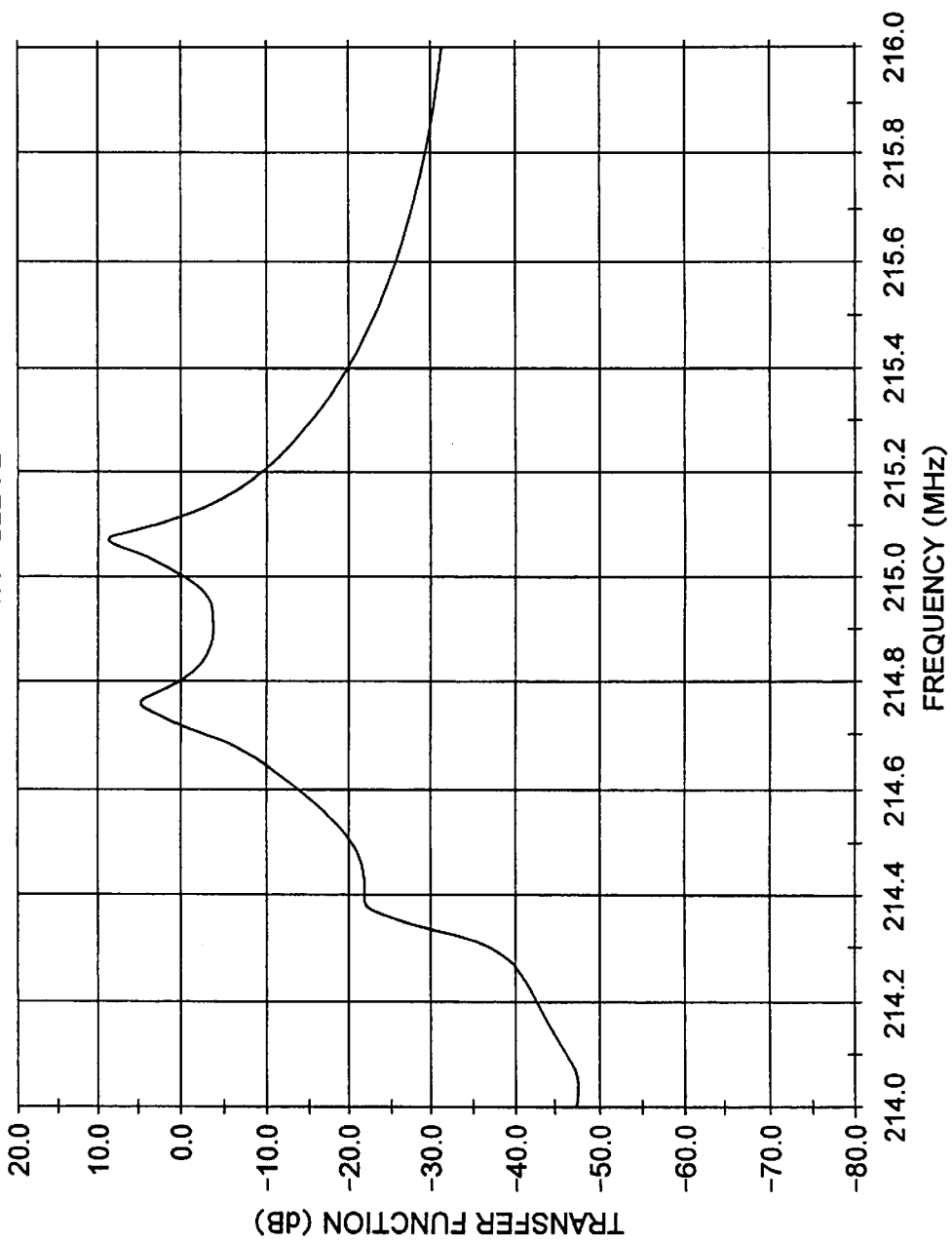
FIG. 10 is a diagram showing the result obtained through simulation, on a 50 Ω condition, of band pass characteristics of a resonant surface acoustic wave filter device that is provided with an IDT of an existing structure.
Figure 11:
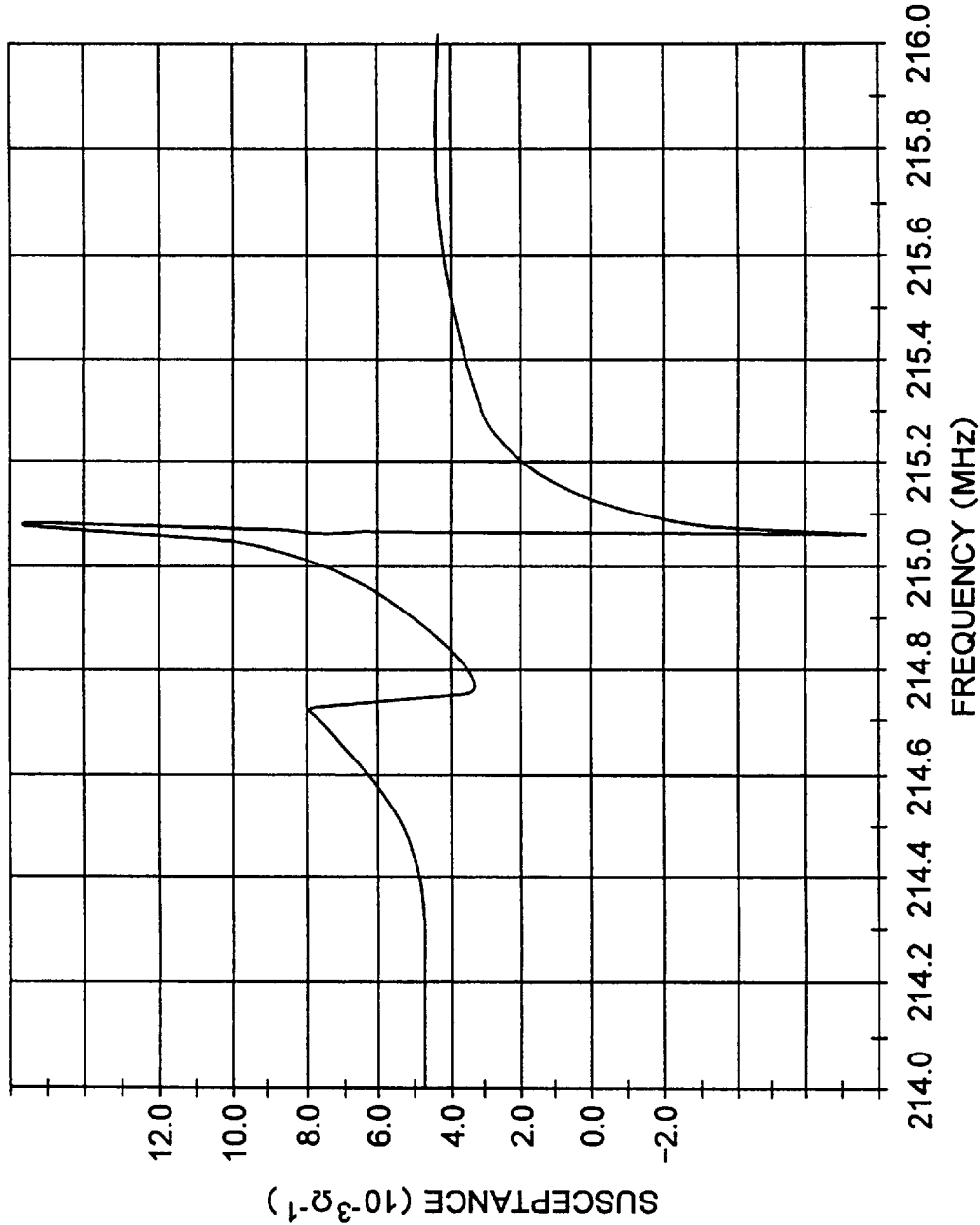
FIG. 11 is a diagram showing the result obtained through simulation, on a 50 Ω condition, of susceptance of a resonant surface acoustic wave filter device that is provided with an IDT of an existing structure.

FIG. 10 is a diagram showing the result of band pass characteristics of the filter device. Further, FIG. 11 is a diagram showing frequency dependence of susceptance of the filter.

Upon comparing the results of embodiments 2, 3 and the comparative example, it is confirmed that, due to the present invention, the loss between respective peaks of the surface acoustic wave filters becomes small, and the attenuation characteristics out of band become large.

(Embodiment 4)

Next, a resonant surface acoustic wave filter of the present invention is manufactured, and the performance thereof measured.

With an ST cut quartz plate as the piezoelectric substrate. GRs are disposed on both sides thereof. Among 125 pairs of electrode fingers of the IDT, 105 pairs are disposed on the first area and 20 pairs are disposed on the second area. The relationship of the pitch Pa of the electrode fingers in the first area and the pitch Pb of the electrode fingers of the second area is set to satisfy Pb=1.023×Pa. Two stages thereof are disposed to form a filter device. The input and output terminals are set at 500 Ω. The stages are not tuned with a coil or a capacitor.

Figure 12:
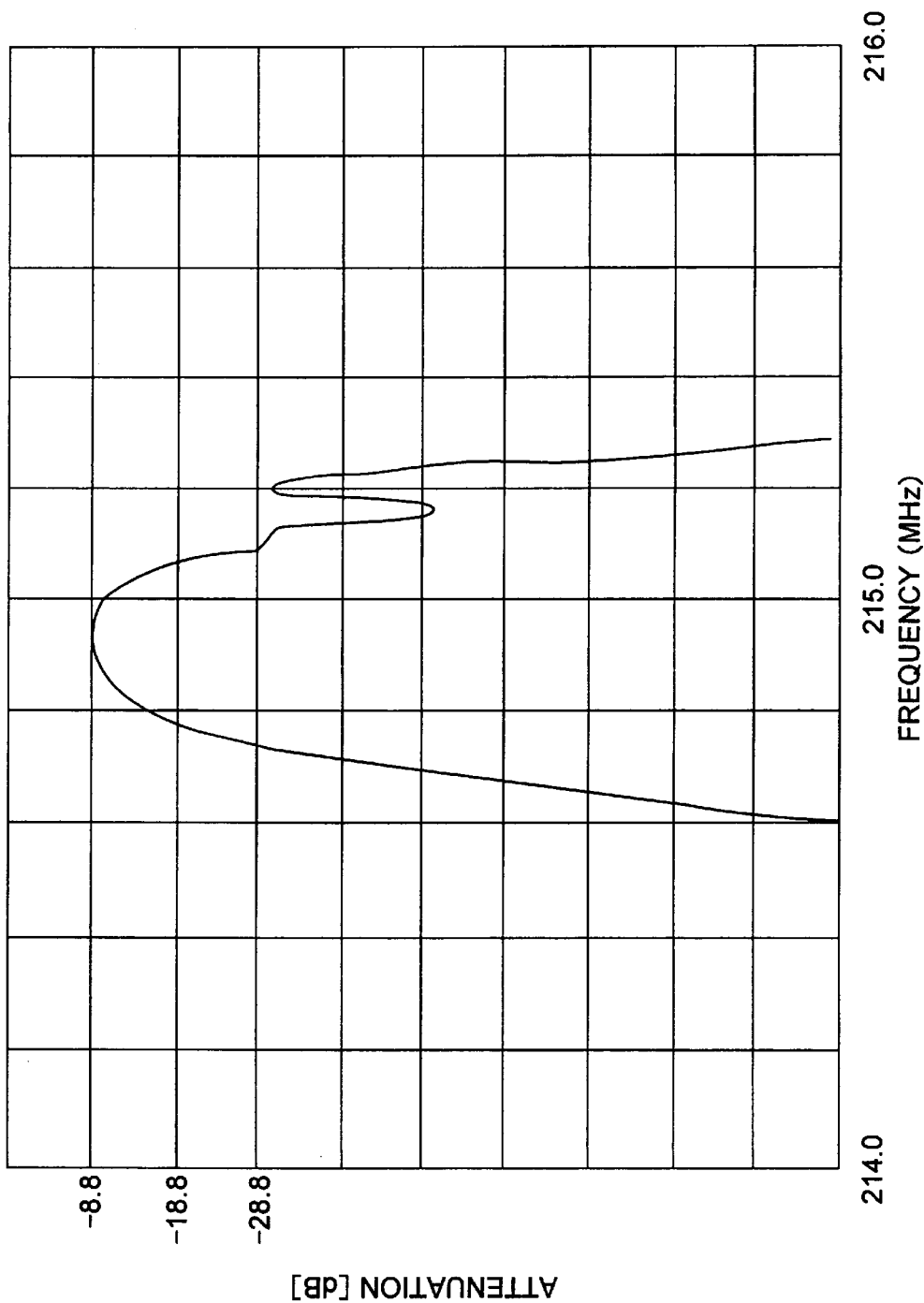
FIG. 12 is a diagram showing the measurement result of band pass characteristics of one embodiment of a resonant surface acoustic wave filter device according to an embodiment of the present invention.
Figure 13:
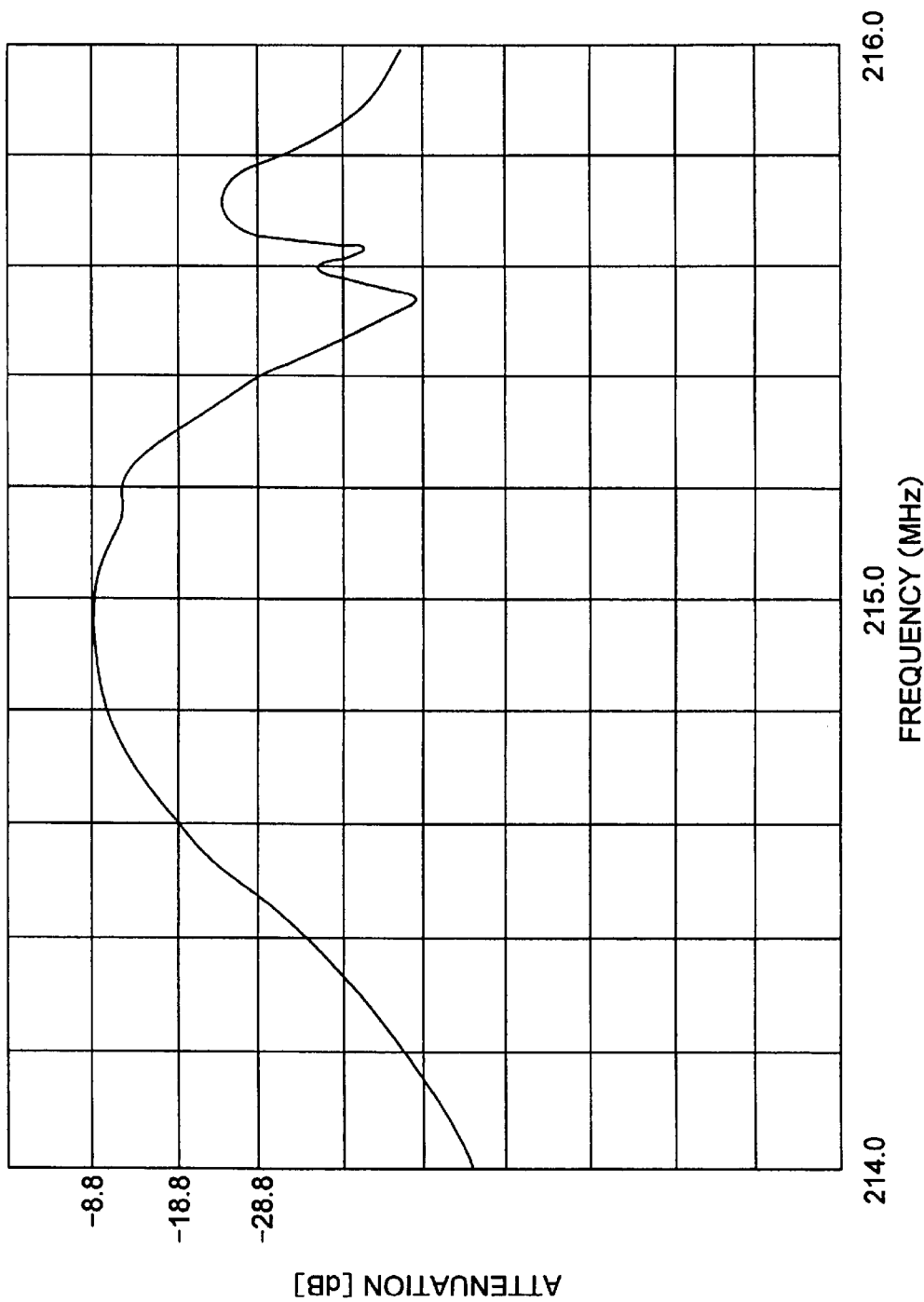
FIG. 13 is a diagram showing the measurement result of band pass characteristics of a resonant surface acoustic wave filter device of an existing structure as a comparative example.

FIG. 12 and FIG. 13 are diagrams showing band pass characteristics of this filter device.

Thus, the surface acoustic wave filter device of the present invention, without tuning between the stages by coils or capacitors, can secure a relative bandwidth of approximately 0.1%, and demonstrates the effectiveness of the present invention.

Further, in the aforementioned description, the ST cut quartz plate is employed as the piezoelectric substrate and an IF filter that postulates use of the tuning circuit is described. However, another piezoelectric substrate or RF filter that does not use the tuning circuit can be employed.

As described above, according to the surface acoustic wave filter device of the present invention, by appropriately selecting the number of pairs and the pitch of the array of the electrode fingers constituting the first area and the second area, the characteristics of the resonant surface acoustic wave filter device can be controlled.

Still further, according to the surface acoustic wave filter device of the present invention, the surface acoustic wave filter device that is low in insertion loss and excellent in cutoff characteristics out of band can be obtained. Therefore, the filter device is particularly suitable for application in a vehicular communication system terminal or the like.

(Embodiment 5)

Figure 14:
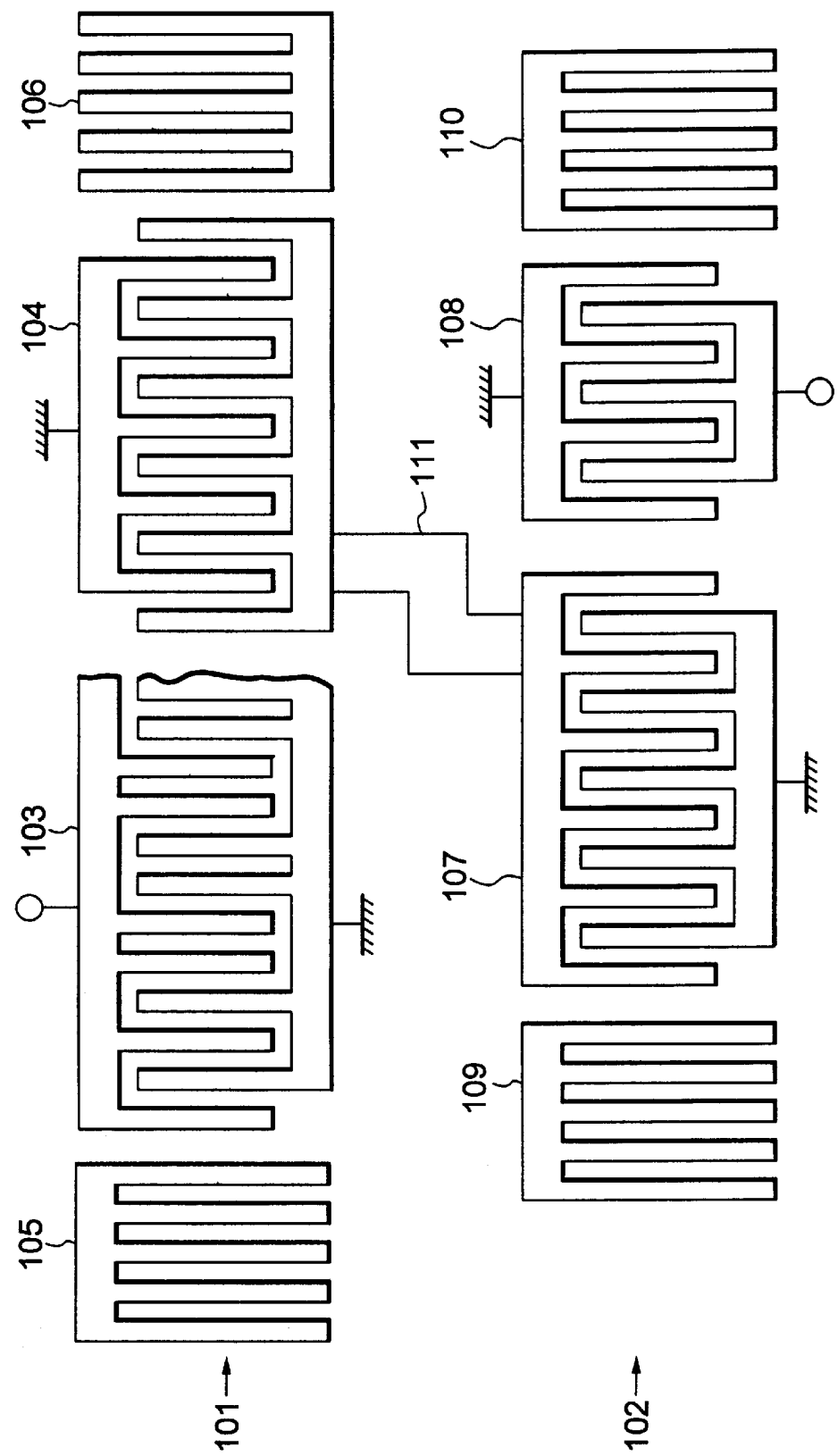
FIG. 14 is a schematic diagram showing an electrode pattern of a surface acoustic wave filter device involving one embodiment of the present invention.

FIG. 14 is a schematic diagram showing electrode patterns of a surface acoustic wave filter device involving one embodiment of the present invention by omitting a part thereof. These electrodes are formed on a piezoelectric substrate such as a 45° X cut LBO substrate. This surface acoustic wave filter device comprises two kinds of IDT filters 101 and 102 connected therebetween. That is, the first IDT filter 101 has two IDTs 103 and 104 disposed a prescribed distance apart and two GRs 105 and 106 disposed to sandwich these IDTs. Similarly, the second IDT filter 102 has two IDTs 107 and 108 disposed a prescribed distance apart and two GRs 109 and 110 disposed to sandwich these IDTs. The IDT 104 of the first IDT filter 101 and the IDT 107 of the second IDT filter 102 are connected through connecting lines 111.

Figure 15:
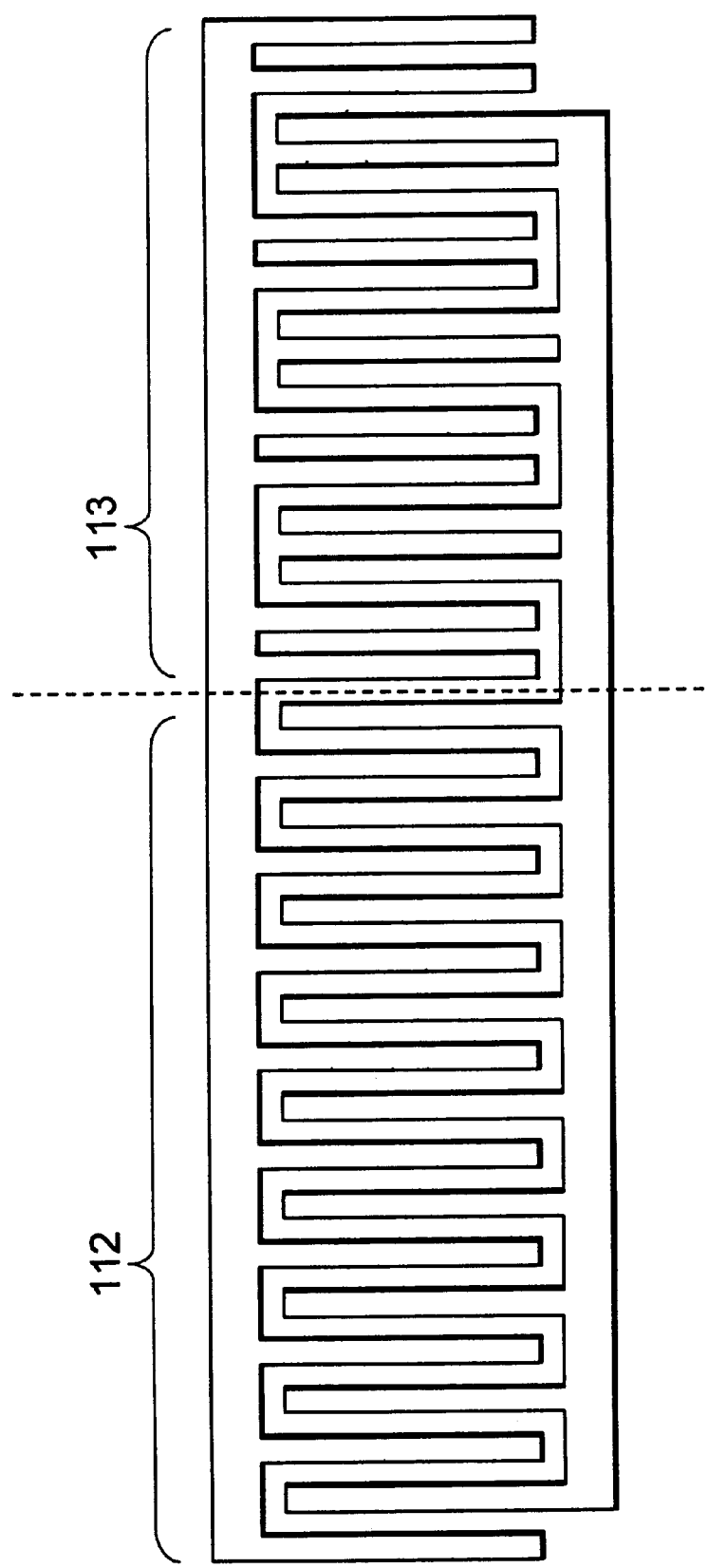
FIG. 15 is a schematic diagram showing a structure of an IDT3 shown in FIG. 14.

FIG. 15 is a schematic diagram showing a structure of the IDT 103. Reference numeral 112 in the figure denotes a solid electrode, reference numeral 113 denotes a split electrode, and the solid electrode 112 and the split electrode 113 are formed adjacent each other. The solid electrode reflects by itself the surface acoustic wave, and therefore is a desirable electrode structure for realizing low loss. On the other hand, in the split electrode, the traveling wave and the reflected wave are 180° different in their phases in order to result in cancellation of the reflected wave in the electrode. Accordingly, the split electrode does not contribute in realization of low loss of the surface acoustic wave filter device.

The surface acoustic wave filter that has the IDT 103 of such a structure, by forming through connection of the solid electrode 112 and the split electrode 113, can obtain the desired frequency dependence while suppressing the impedance variation during control of the characteristics to a minimum.

Figure 16:
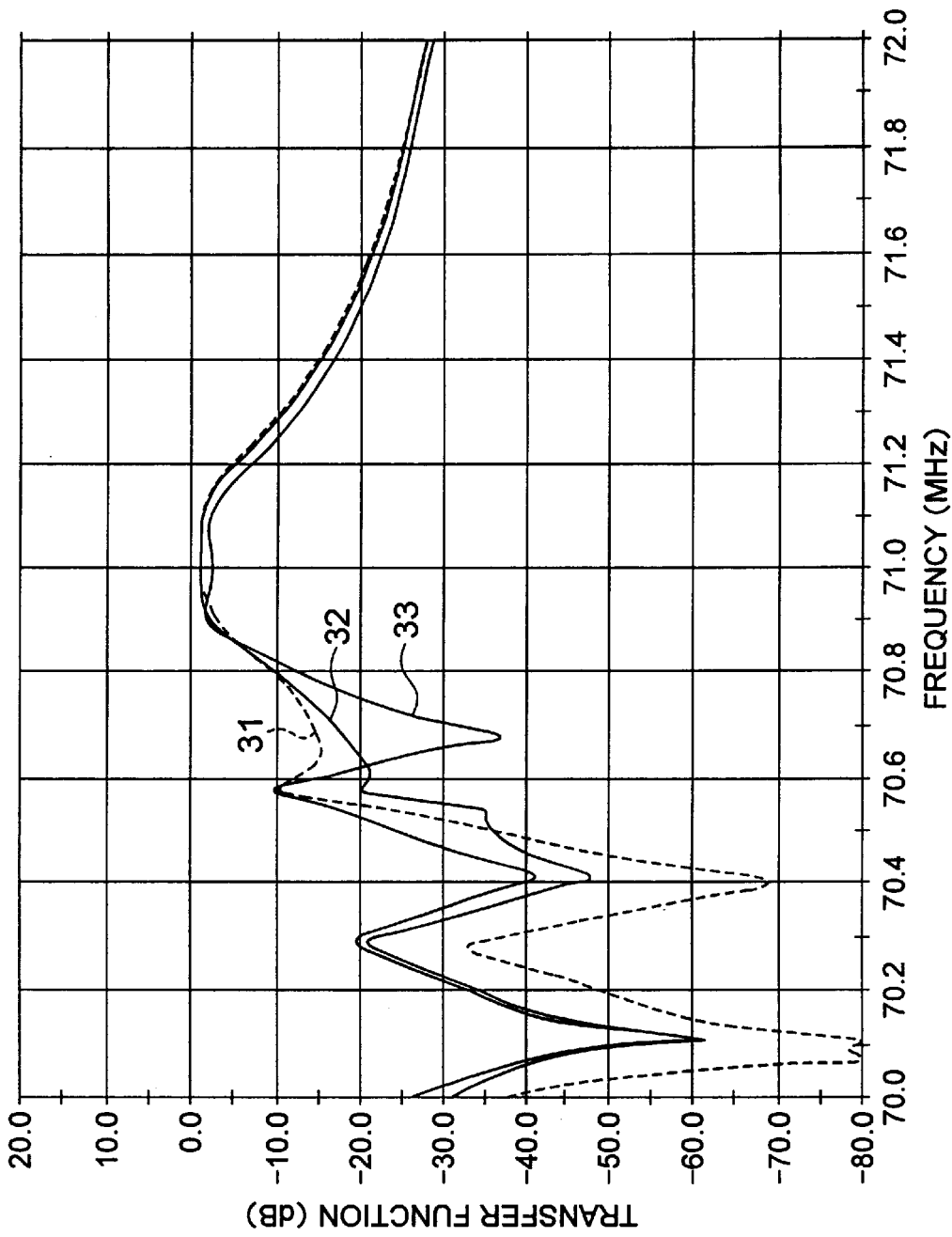
FIG. 16 is a diagram showing the results of simulation for describing the effect of the present invention.

Results of simulation carried out to confirm such an effect are shown in FIG. 16. A resonant filter device on a 600 Ω condition is formed by disposing two IDTs on a 45° X cut LBO substrate, and the solid electrode and the split electrode of one IDT of two are connected. This resonant filter device on a 600 Ω condition is simulated based on an equivalent circuit of Smith. The results are shown in FIG. 16.

The number of the electrode fingers of the IDT to which the present invention is applied and the number of the electrode fingers of the IDT of existing technology to which the present invention is not applied are made the same.

Further, the central frequency of the split electrode is set to be one half of the central frequency of the solid electrode. The IDT comprises two first areas having the solid electrode and one second area having the split electrode.

In FIG. 16, reference numeral 32 shows the result of the IDT in which number of the split electrode fingers is one half the number of the solid electrodes, reference numeral 33 shows the result of the IDT in which number of the split electrode fingers is equal to that of the solid electrode fingers, and reference numeral 31 shows for comparison the result of an existing IDT that does not include a split electrode. As the ratio of the split electrode increases, steepness of the filter device increases. In this embodiment, however, the steepness particularly in low frequency side is increased. Further, as the number of the split electrodes is increased, the impedance of the surface acoustic wave filter device deviates from the prescribed impedance to reduce the effect of the present invention.

Figure 17:
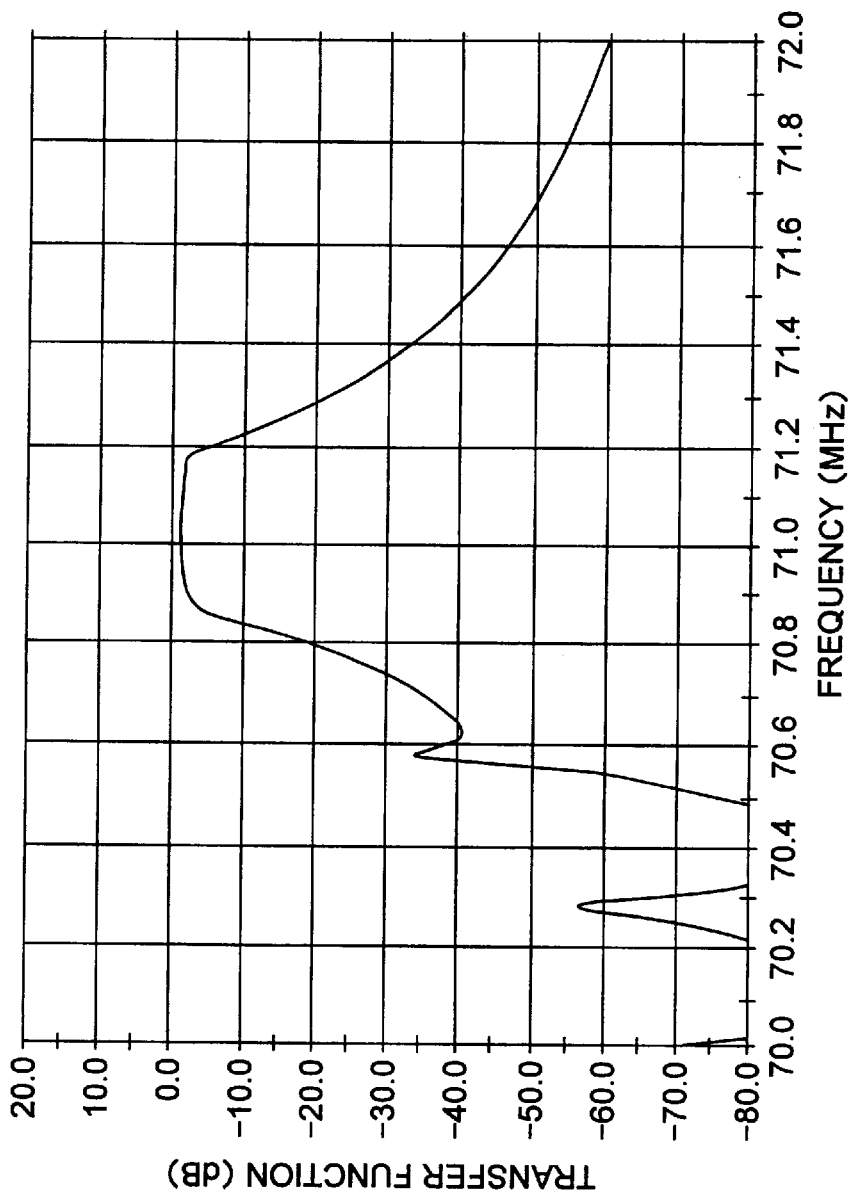
FIG. 17 is a diagram showing the result of simulation of a surface acoustic wave filter device to which the present invention is applied.
Figure 18:
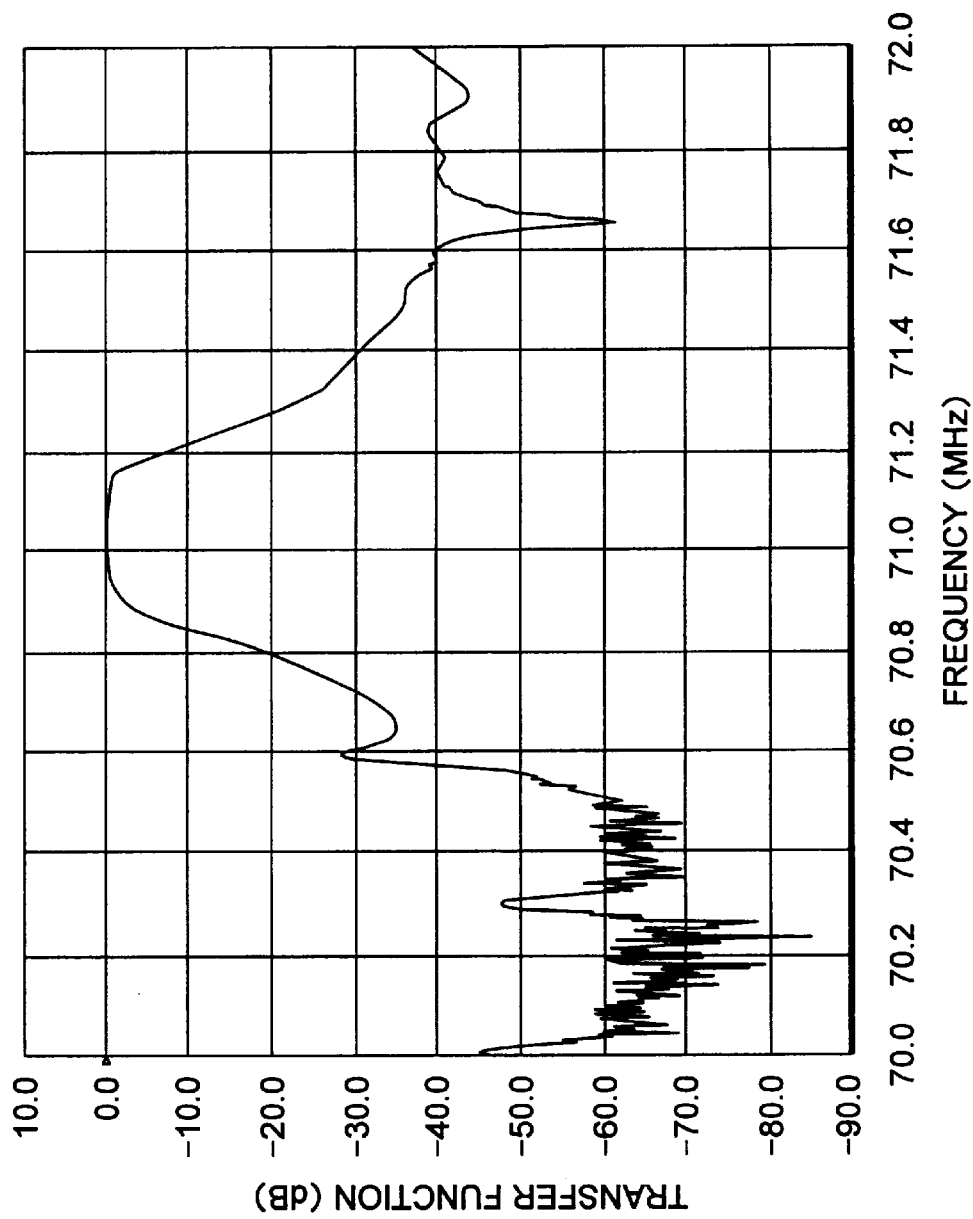
FIG. 18 is a diagram showing frequency dependence of the surface acoustic wave filter device obtained by applying the present invention.

FIG. 17 shows the result of simulation of the surface acoustic wave filter device in which the resonant filter comprises the resonant filters 31 and 32 shown in FIG. 16 by connecting two stages. FIG. 18 shows the result from an actual surface acoustic wave filter device and the evaluation thereof is carried out in a circuit that is adjusted to be 600 Ω by use of a condenser and a coil.

Figure 19:
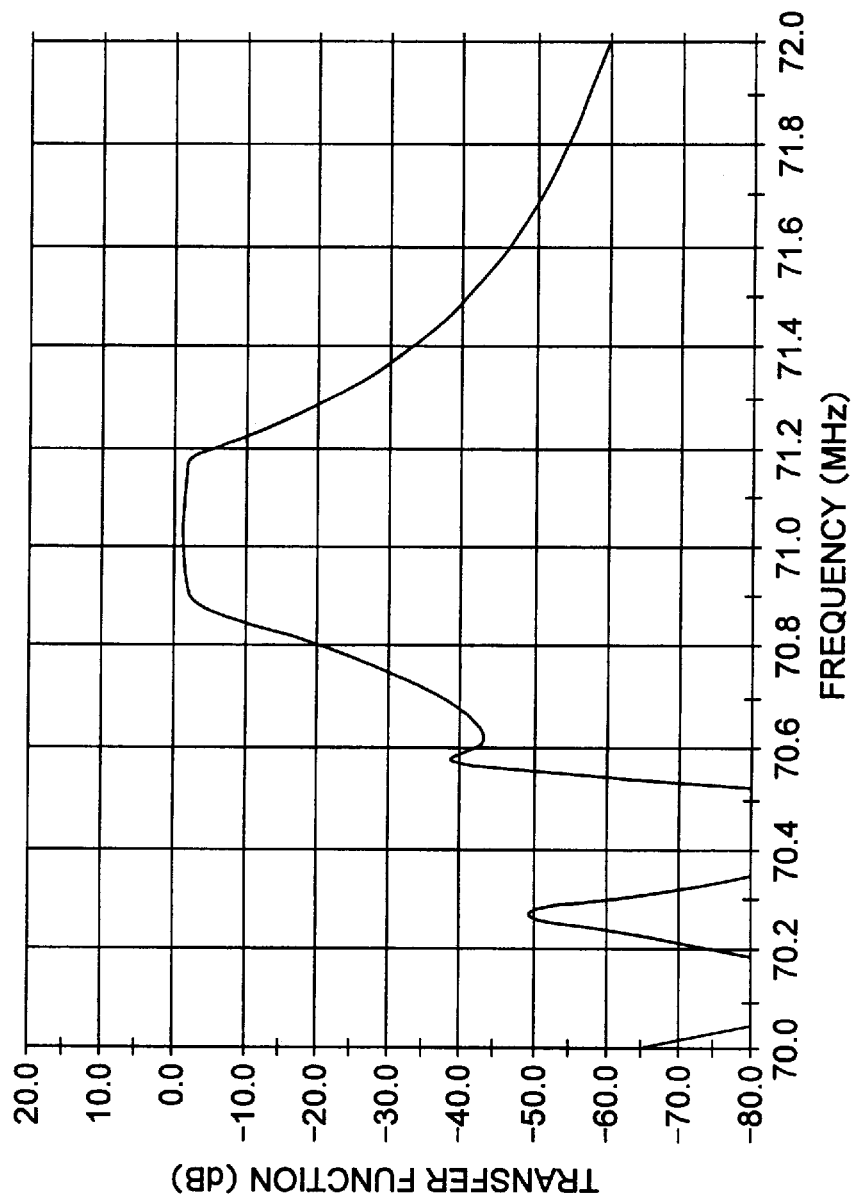
FIG. 19 is a diagram showing the result of simulation of a surface acoustic wave filter device, to which the present invention is applied.
Figure 20:
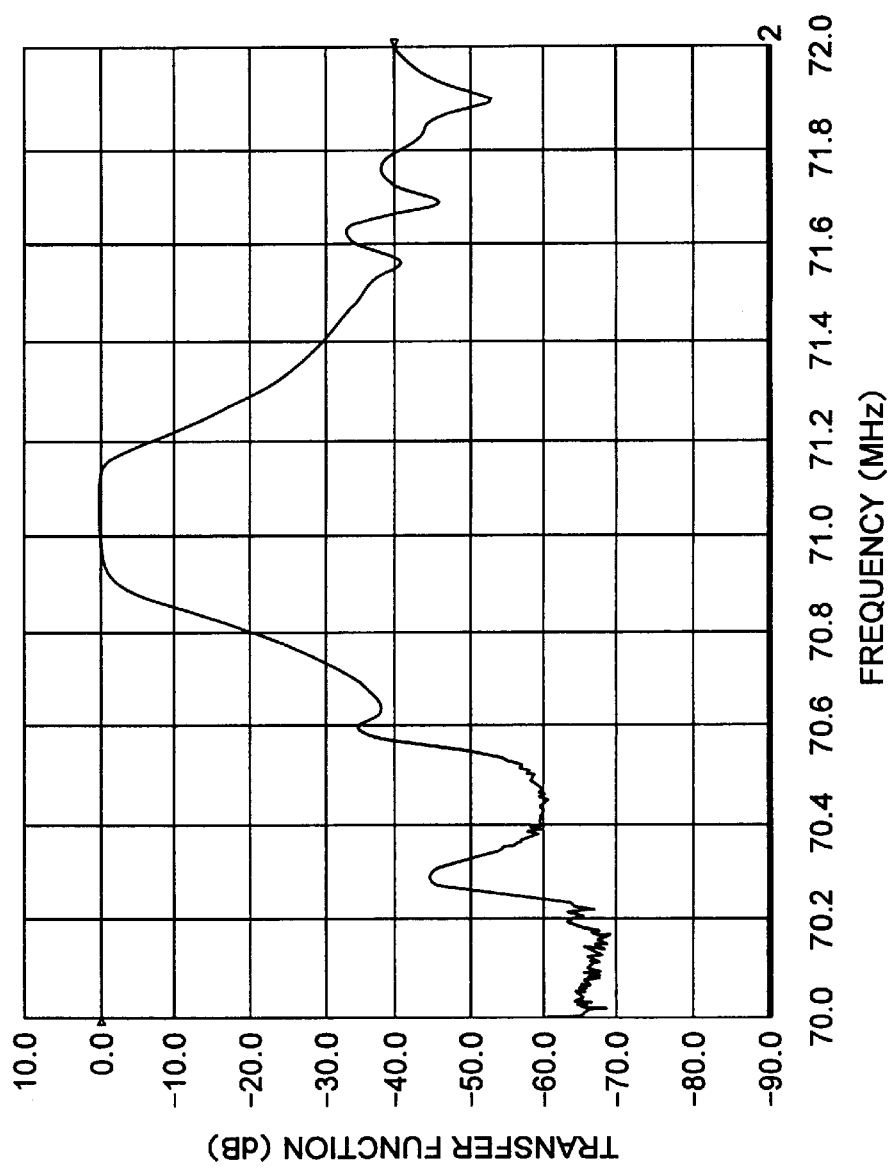
FIG. 20 is a diagram showing frequency dependence of the surface acoustic wave filter device obtained by applying the present invention.

Further, FIG. 19 shows the result of simulation of the surface acoustic wave filter device that connects two resonant filters 32 shown in FIG. 16 in series. FIG. 20 shows the result of evaluation of a surface acoustic wave filter device actually prepared. The evaluation of the surface acoustic wave filter is carried out by use of the circuit identical to that in which the surface acoustic wave filter device described above is evaluated.

In any cases, the result of the simulation and the evaluation of the actual filter device resemble very well. Thus, the effect of the present invention is confirmed.

Figure 21:
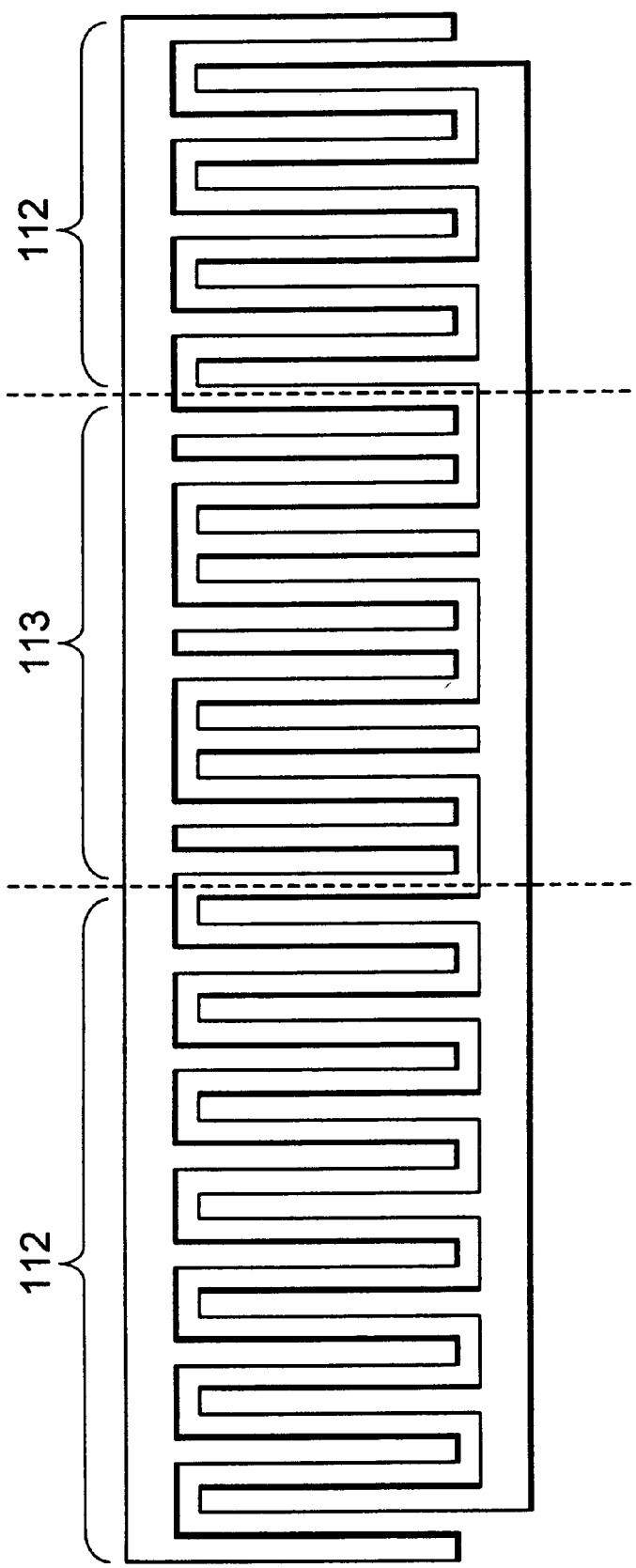
FIG. 21 is a schematic diagram showing another structure of an IDT involving the present invention.
Figure 22:
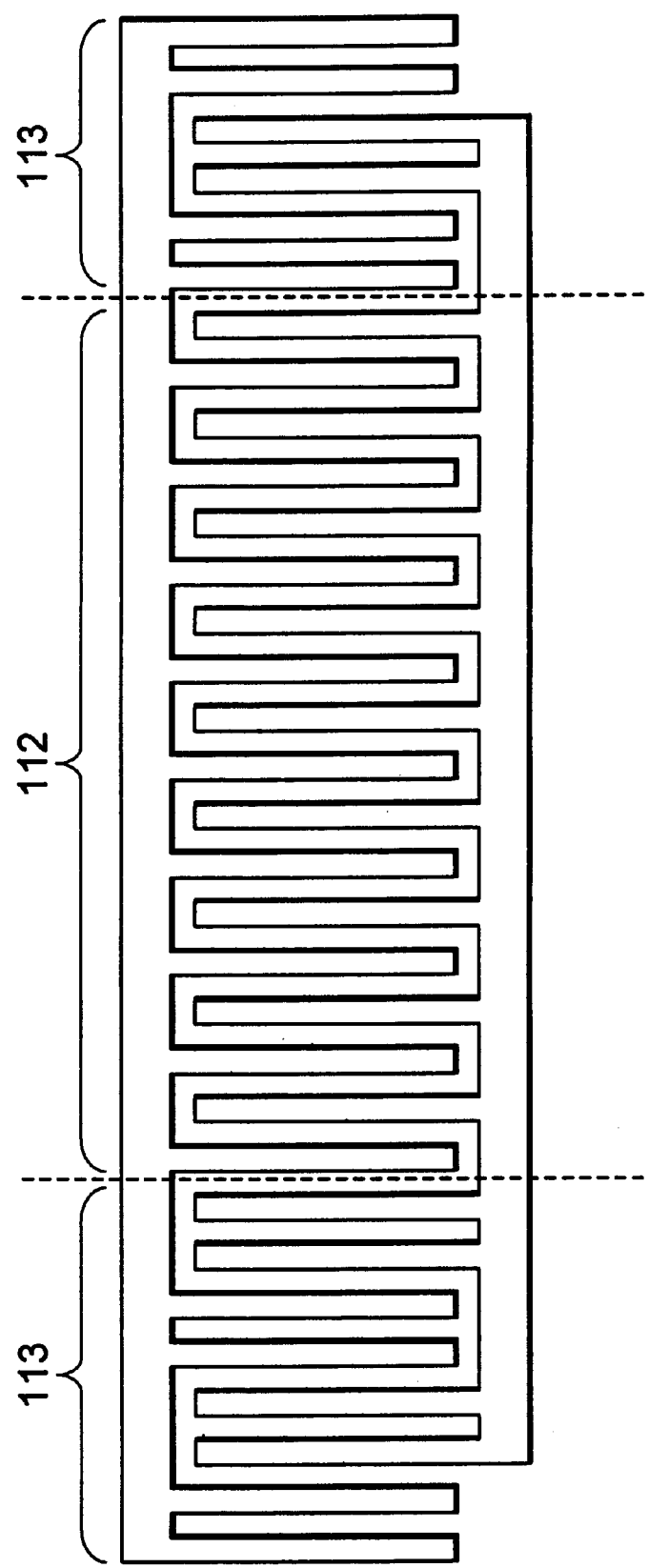
FIG. 22 is a schematic diagram showing still another structure of an IDT involving the present invention.

The present invention is not restricted to the aforementioned embodiments. For example, in the aforementioned embodiments, as shown in FIG. 15, the solid electrode 112 and the split electrode 113 are formed adjacent. However, as shown in FIG. 21, the split electrode 113 can be sandwiched by the solid electrode 112. Or, as shown in FIG. 22, the solid electrode 112 can be put between the split electrodes 113.

As described above, according to the present invention, while suppressing the impedance variation to the minimum level during control of filter characteristics, desired frequency dependence can be obtained, and the freedom of design can be improved remarkably.

(Embodiment 6)

Figure 23:
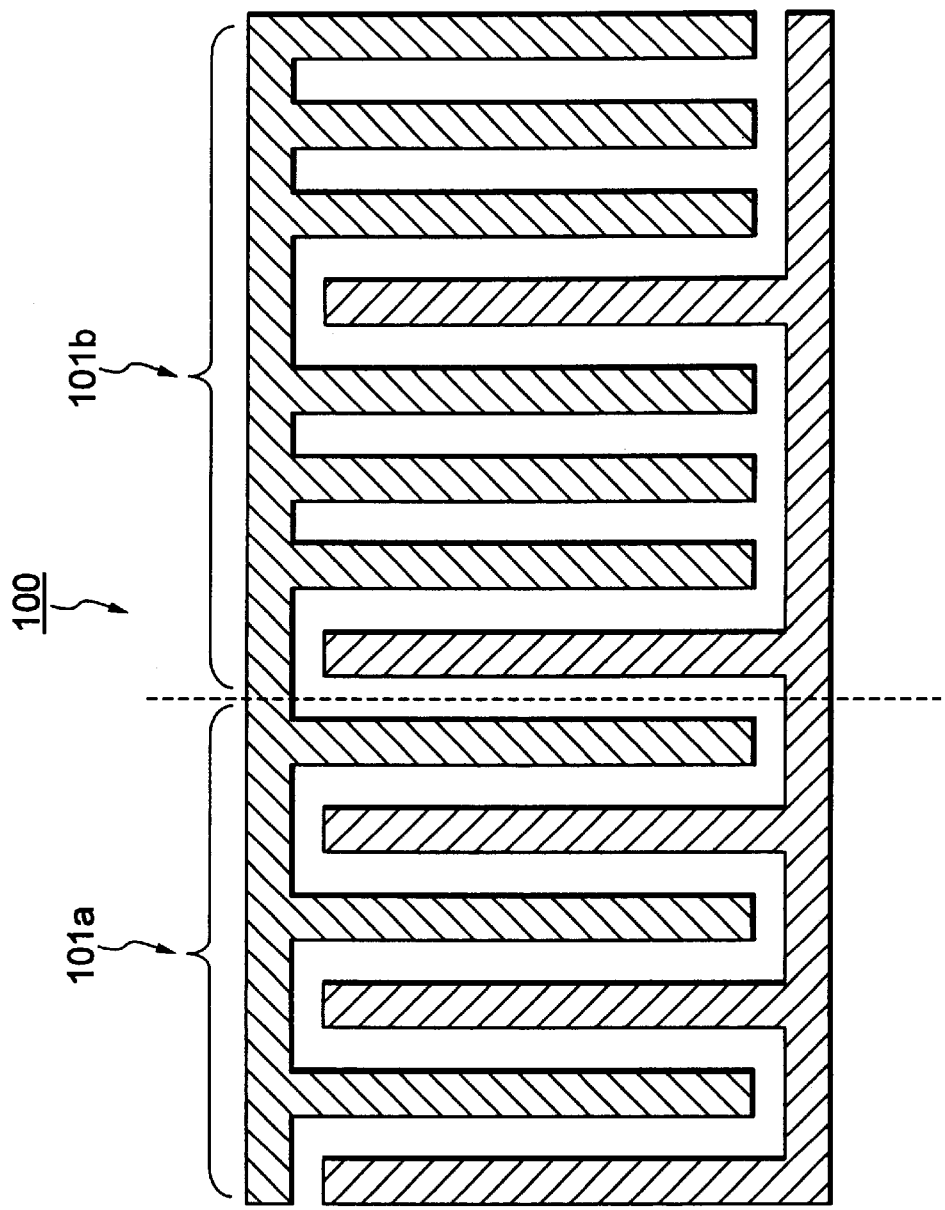
FIG. 23 is a schematic diagram showing a structure of an IDT that is provided to the surface acoustic wave filter device of the present Invention.
Figure 24:
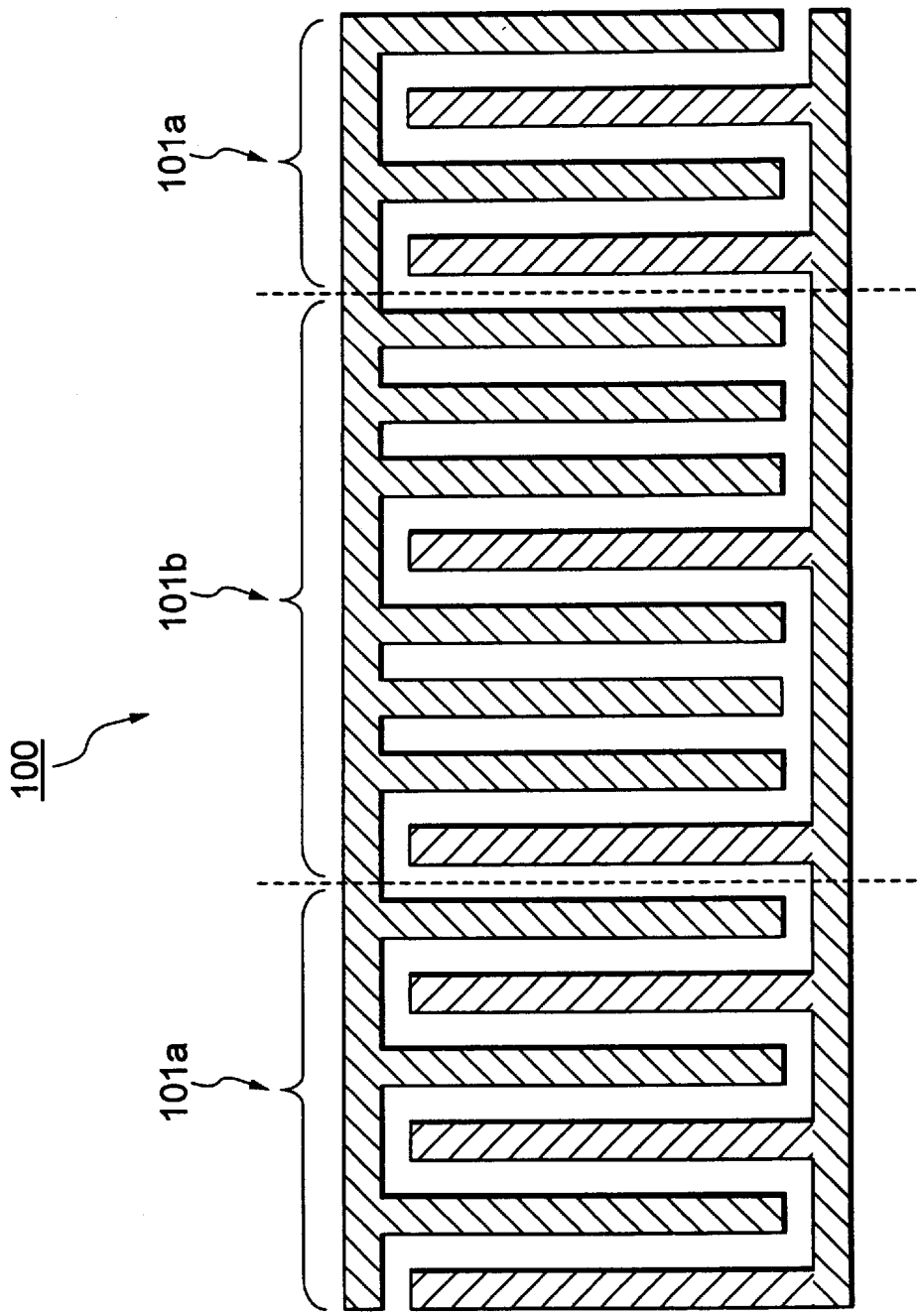
FIG. 24 is a schematic diagram showing another structure of the IDT that is provided to the surface acoustic wave filter device of the present invention.
Figure 25:
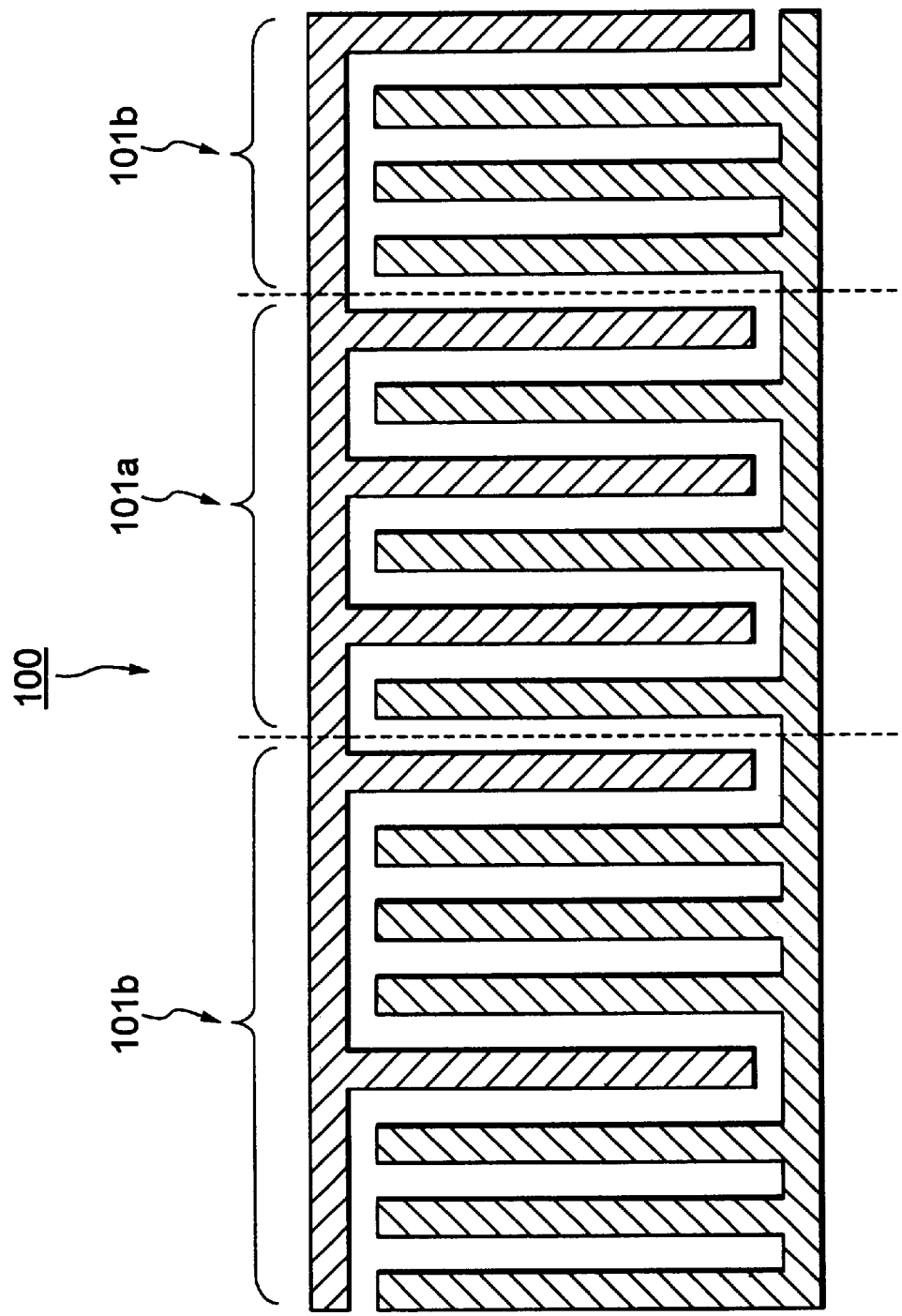
FIG. 25 is a schematic diagram showing still another structure of the IDT that is provided to the surface acoustic wave filter device of the present invention

FIG. 23, FIG. 24 and FIG. 25 are diagrams showing structures of the IDTs (IDT) that the surface acoustic wave filter devices of the present invention comprise.

The IDT 100 illustrated in FIG. 23, comprises a first area 101a consisting of solid electrode fingers two of which provide a unit cycle of polarity and a second area 101b consisting of solid electrode fingers, an even number of four or more of which provide a unit cycle of polarity upon application of signal.

Further, as shown in, for example, FIG. 24 and FIG. 25, a plurality of the first area 101a in which a unit cycle of polarity comprises two electrodes fingers and a plurality of the second area 101b in which a unit cycle of polarity comprises an even number of four or more electrode fingers may be disposed in one IDT 100.

In the case that a surface acoustic wave filter device has a plurality of IDTs, at least one IDT can have the first area 101a and the second area 101b. In addition, for each IDT 100, any one of the constitutions illustrated in, for example, FIG. 23, FIG. 24 and FIG. 25 may be employed. That is, all the IDTs that one surface acoustic wave filter device comprises are not required to be the same.

Figure 26:
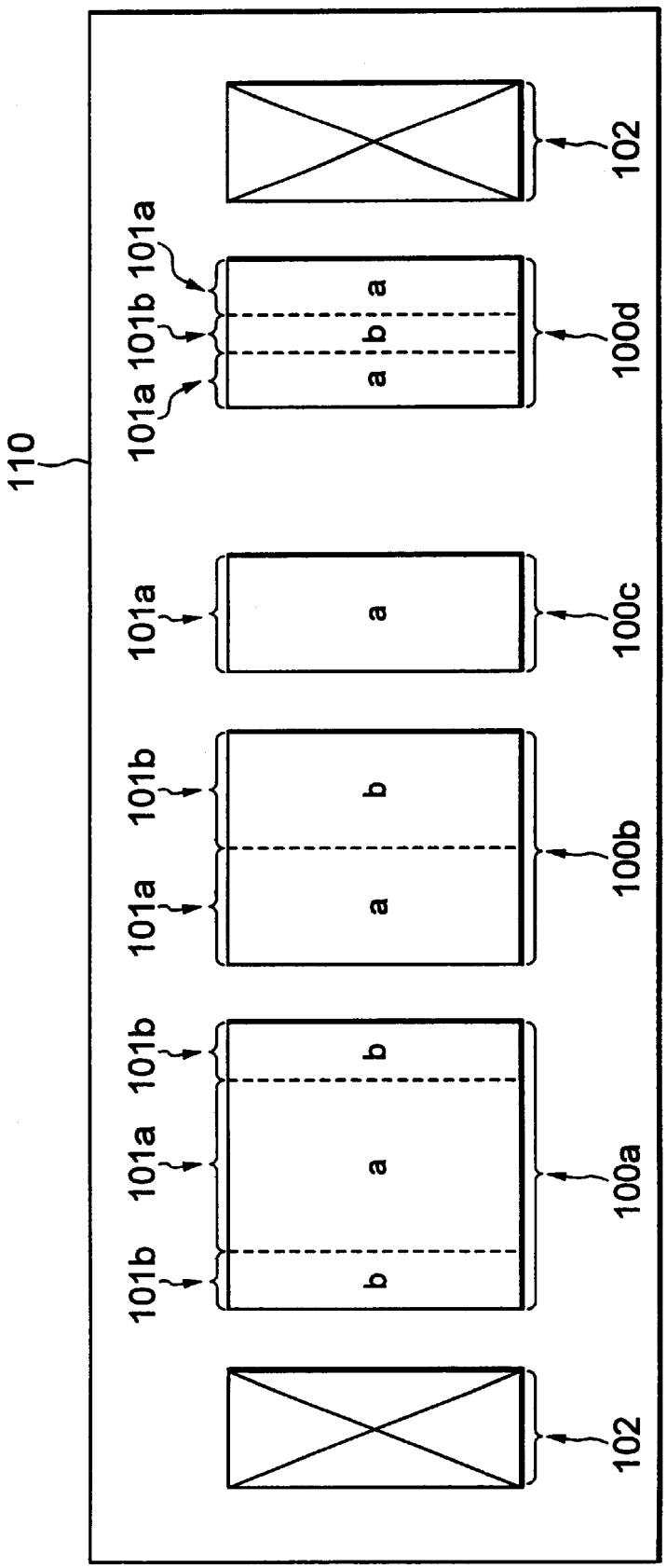
FIG. 26 is a schematic diagram showing a constitution of the surface acoustic wave filter device of the present invention.

FIG. 26 is a schematic diagram showing a constitution of a surface acoustic wave filter device of the present invention. On a piezoelectric substrate 110, IDTs 100a, 100b and 100d each of which consists of the aforementioned first area and second area 101a and 101b, and an IDT 100c as similarly solid as an existing one are formed between reflectors 102. The phase relation of the first area 101a and the second area 101b can be in phase or in inverted phase. This phase relation also can control the characteristics of the surface acoustic wave filter device.

Further, also in the case that there is a plurality of the second areas 101b in one IDT, each second area 101b can be in phase or in inverted phase with respect to the first area 101a. Further, the phase relation in phase and that in inverted phase can be combined.

Figure 27A:
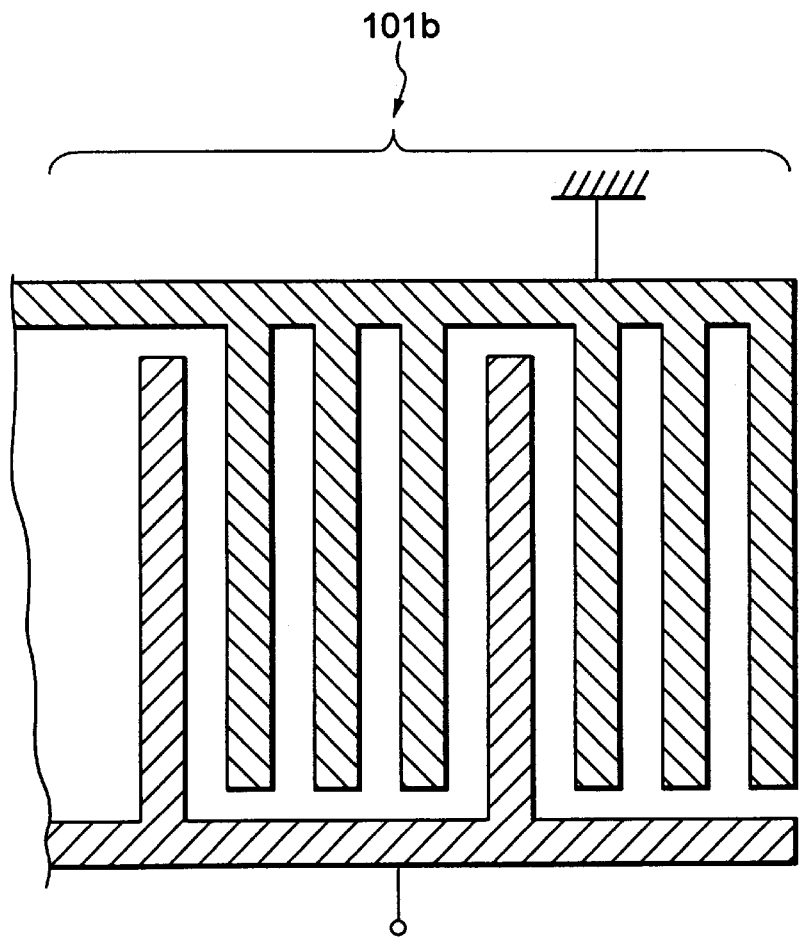
FIG. 27A and FIG. 27B are schematic diagrams describing an example of a constitution of a second area constituting an IDT of the surface acoustic wave filter device of the present invention.
Figure 27B:
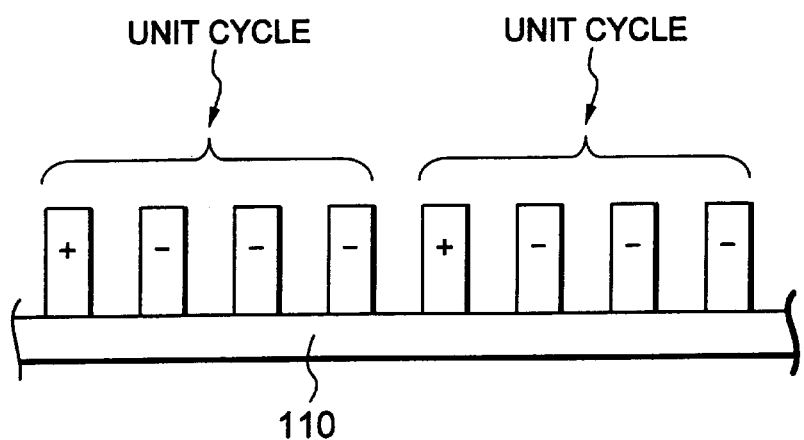

FIG. 27A and FIG. 27B are schematic diagrams describing an example of a second area 101b that an IDT of the surface acoustic wave filter device of the present invention comprises The second area 101b of the IDT comprises three electrode fingers of one polarity and a electrode finger of the other polarity which provide a unit cycle when an electric signal is applied. The actual surface acoustic wave filter has reflectors 102 at the most outside portion of the exciting direction of the surface acoustic wave of the IDT. Further, a plurality of IDTs may be disposed between the reflectors.

(Embodiment 7)

In the following, an example will be described in which the present invention is applied to a 800 Ω condition resonant surface acoustic wave filter in which two IDTs, and the reflectors sandwiching these IDTs are formed on a 45° X cut LBO substrate (Lithium Boron Oxide).

Each IDT comprises 44 pairs in terms of IDT that forms a unit cycle of two electrode fingers, and the GR comprises 500 electrode fingers, and the aperture length is set at 10λ (λ: a central frequency of this surface acoustic wave filter). Further, the IDTs and reflectors are formed of conductive thin film consisting of an alloy of Al—Cu—Si by use of the sputtering method or the like, and the thickness thereof is set at approximately 1% of the wavelength of the excited surface acoustic wave. The IDTs comprise, as identical as the second area 101b shown in FIG. 23 and FIG. 27A and FIG. 27B, three electrode fingers of one polarity and a electrode finger of the other polarity to provide a unit cycle. Among IDTs, to 10 pairs of electrode fingers whose two fingers form a unit cycle, the present invention is applied. And so as not to change the number of the exciters, the number of the electrode fingers of the applied portion is doubled.

Figure 28:
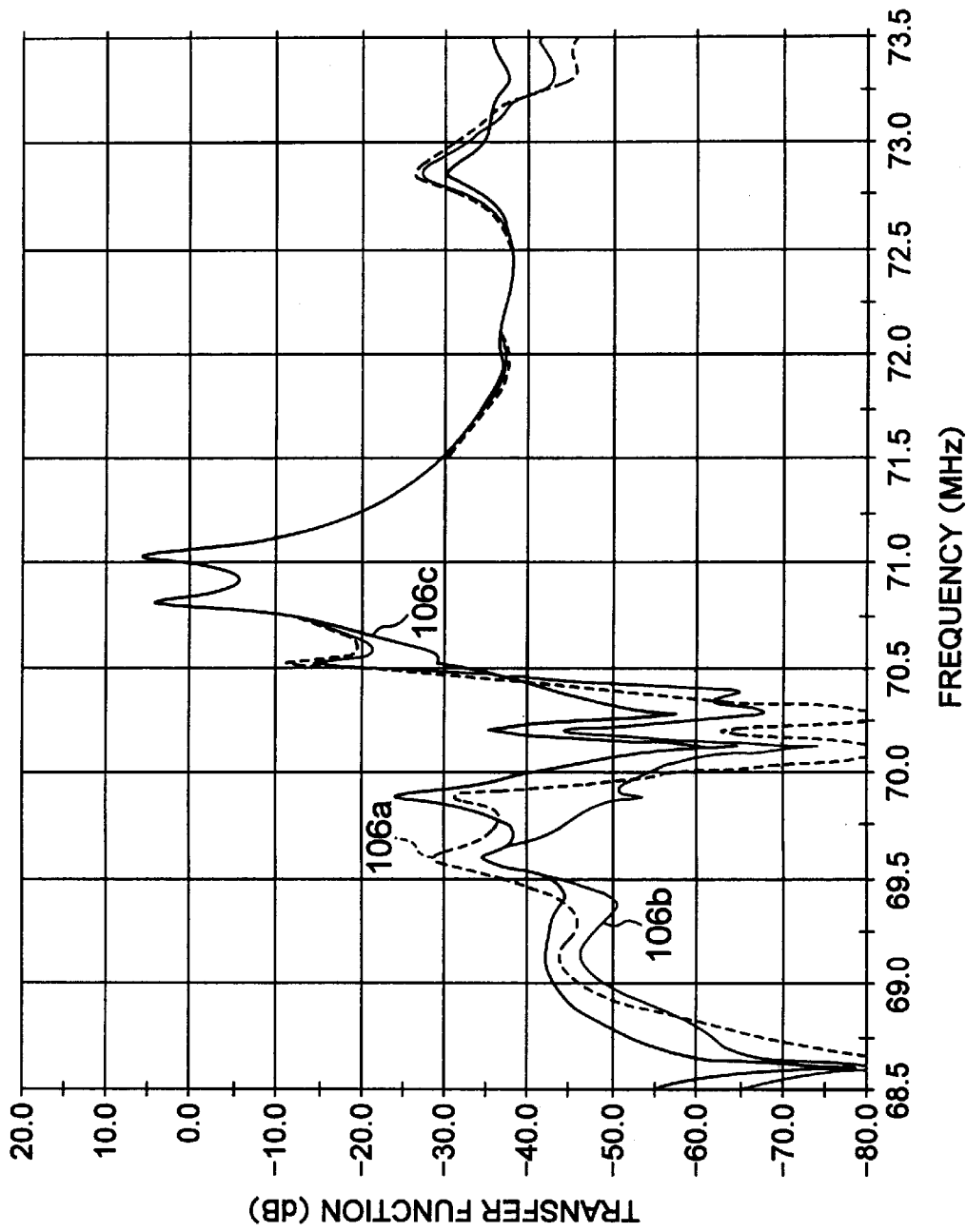
FIG. 28 is a diagram showing results of a simulation of a surface acoustic wave filter device of the present invention.

FIG. 28 shows the results of simulation in which the surface acoustic wave filter device of the present invention is on a 50 Ω condition.

Among profiles shown in FIG. 28, reference numeral 106a shows the result of a comparative example to which the present invention is not applied, and profiles 106b and 106c show the results of surface acoustic wave filters to which the present invention is applied.

The phase relationship of surface acoustic wave excited in the first area 101a of the IDT 100 and that excited in the second area 101b is designed to be in phase in 106b and in inverted phase in 106c.

As obvious from the results of simulation, the present invention can control the attenuation out of band without influencing the characteristics in the neighborhood of the pass band.

Further, by applying the present invention in the inverted phase relation, the steepness of the attenuation characteristics in the neighborhood of the band is increased. However, the attenuation in the lower frequency portion than that of the band becomes small. Namely, they are in a tradeoff relationship.

Figure 29:
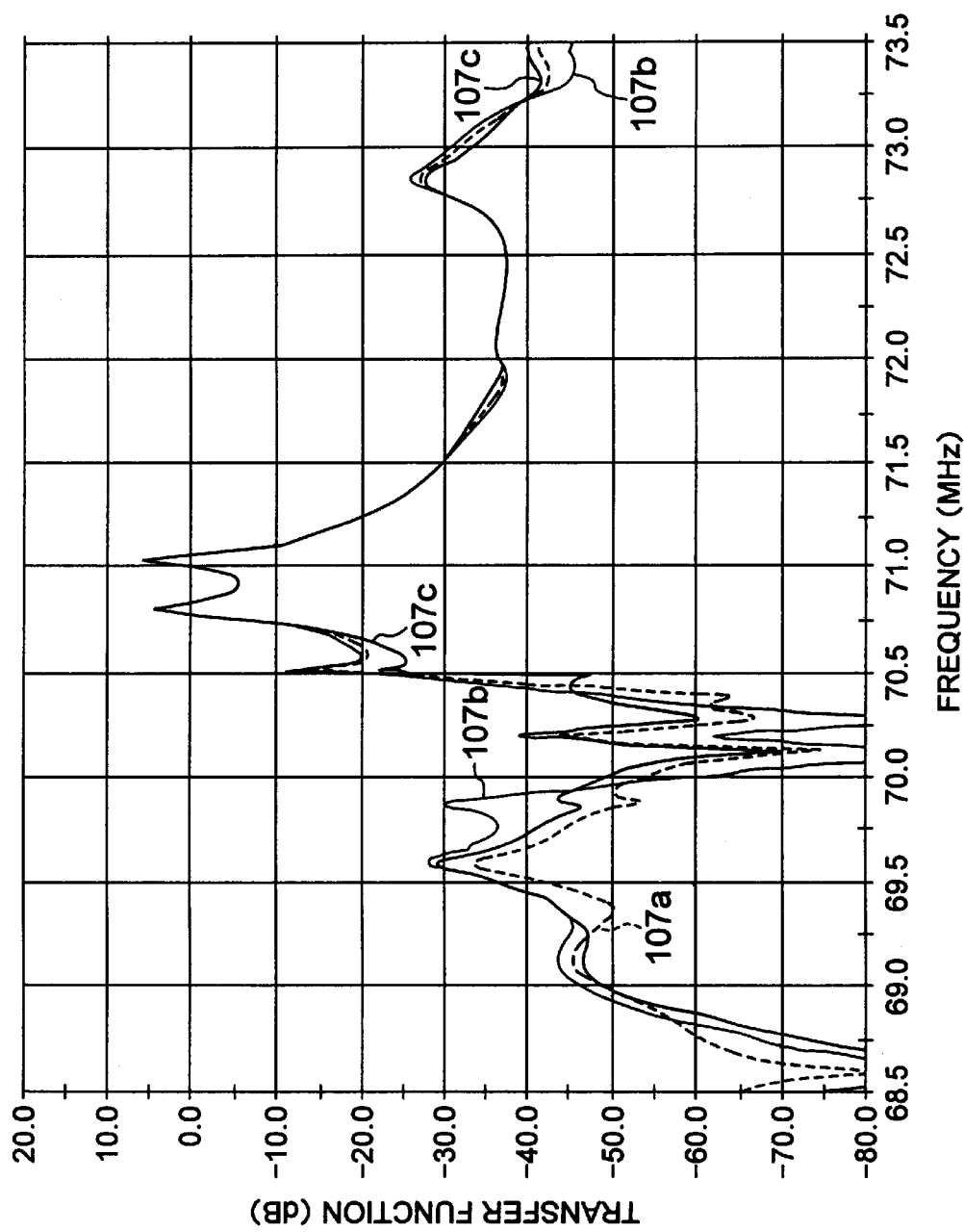
FIG. 29 is a diagram showing results of a simulation of characteristics of a surface acoustic wave filter device when the ratio of the first area and the second area is varied.

FIG. 29 shows the results of simulation in wich surface acoustic wave filter devices of the present invention are on a 50 Ω condition.

The surface acoustic wave filter device comprises a structure of the IDT as identical as that of the profile 106b shown in FIG. 28. That is the IDT is configured so that the phase relationship of the surface acoustic wave excited at the first area 101a and the surface acoustic wave excited at the second area 101b where four electrode fingers providing a unit cycle is In phase. FIG. 29 shows the result of simulation on a 50 Ω condition when the ratio of the second area 101b to the first area 101a is increased (number of total electrode fingers is the same).

Profile 107a shows the frequency dependence of the comparative example to which the present invention is not applied. Profile 107b shows the frequency dependence of the case where the first area of the IDT comprises 10 equivalent pairs in terms of IDT. Profile 107c shows the frequency dependence of the case where the first area 101a of the IDT comprises 20 equivalent pairs in terms of IDT.

By increasing the number of the electrode fingers to which the present invention is applied, the attenuation out of a band in the neighborhood of the pass band becomes steep, however the attenuation in the lower frequency portion than the band deteriorates as a tradeoff.

(Embodiment 8)

Now, since the chip size is restricted in the actual device, the number of the electrode fingers that can be formed is limited. That is, in the case of the present invention being applied to the actual device, it is desirable to select the number of the electrode fingers that the first area 101a and the second area 101b comprise, and the mutual phase relationship so that the required characteristics can be obtained.

Figure 30:
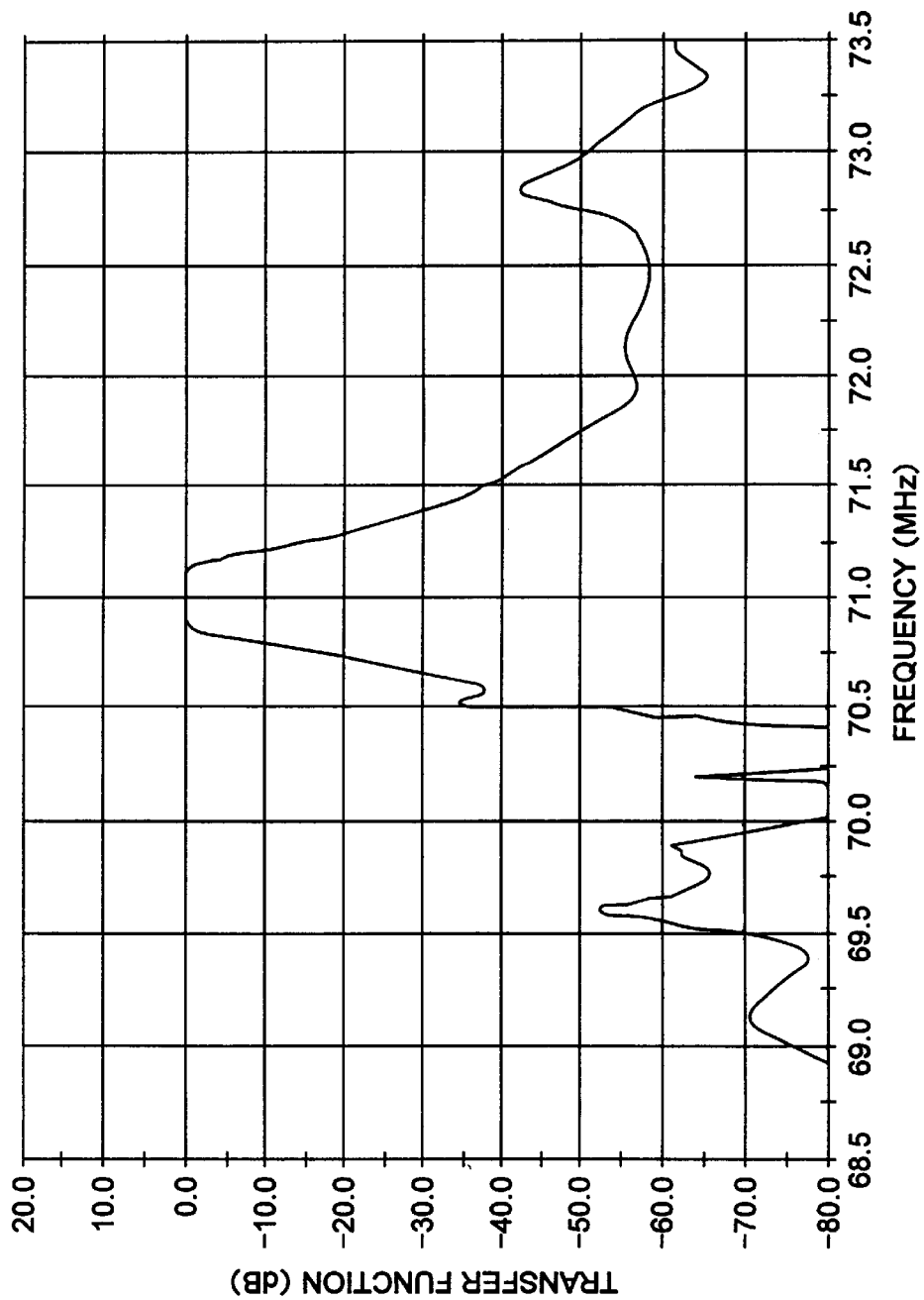
FIG. 30 is a diagram showing frequency dependence of surface acoustic wave filter device characteristics of an embodiment of the present invention.

FIG. 30 is a schematic diagram showing characteristics of another surface acoustic wave filter device of the present invention.

In this example, a resonant surface acoustic wave filter having the profile 106a, and a resonant surface acoustic wave filter having the profile 106b are connected in series to form a surface acoustic wave filter device of two stage constitution as shown in FIG. 28. This surface acoustic wave filter device is simulated by on an 800 Ω condition. The result is shown in FIG. 30.

The aforementioned surface acoustic wave filter device is actually manufactured and is evaluated for its frequency dependence in a circuit adjusted to 800 Ω by use of a condenser and a coil. The result is shown in FIG. 31.

Figure 31:
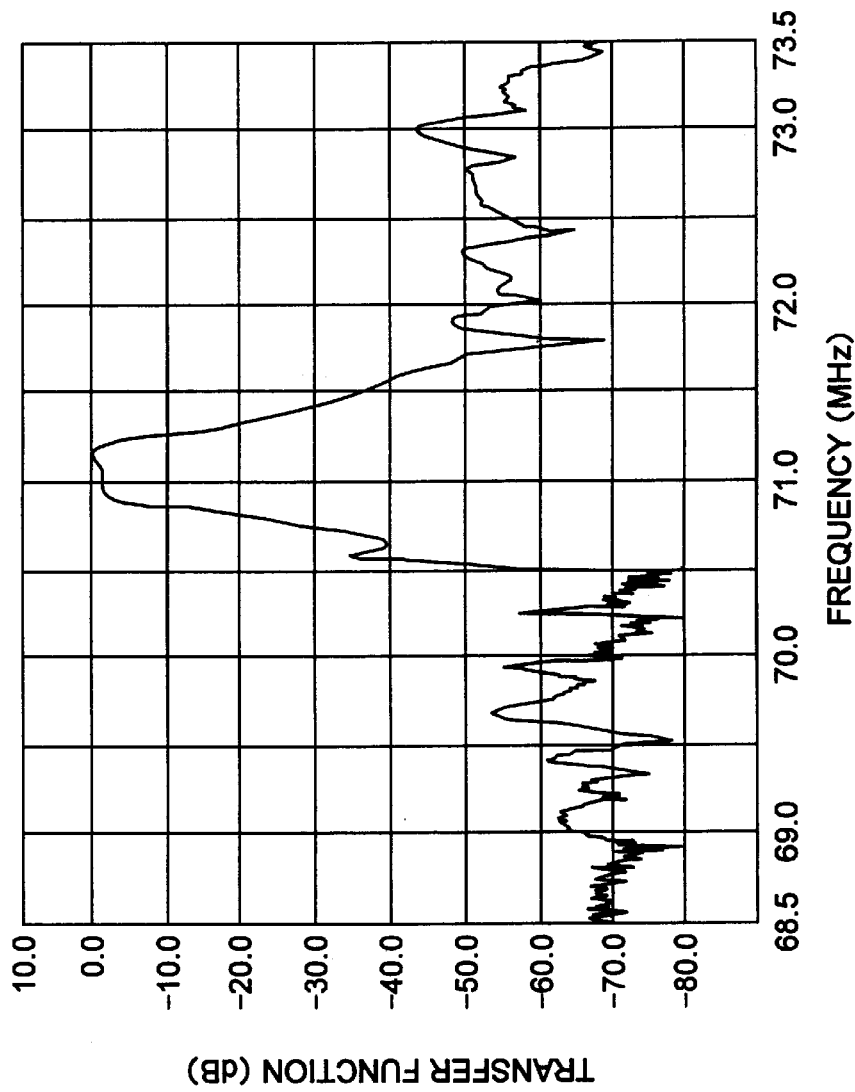
FIG. 31 is a schematic diagram showing frequency dependence of the surface acoustic wave filter device characteristics to which the present invention is applied.

As evident from FIG. 30 and FIG. 31, the frequency dependence of the simulation and the actual surface acoustic wave filter device resemble very well. Thus, according to the present invention, the characteristics of the surface acoustic wave filter device can be controlled with flexibility. Further, with the impedance variation as small as possible during control of filter characteristics, the surface acoustic wave filter device comprising the resonant surface acoustic wave filter device can be improved remarkably in freedom of design.

In the aforementioned embodiment, with a 45° X cut LBO substrate as the piezoelectric substrate, a resonant filter device of an 800 Ω condition consisting of two IDTs is formed and described. It can be applied to the filter device that is driven on a pure 50 Ω condition such as an other piezoelectric substrate and RF filter device.

(Embodiment 9)

Figure 32:
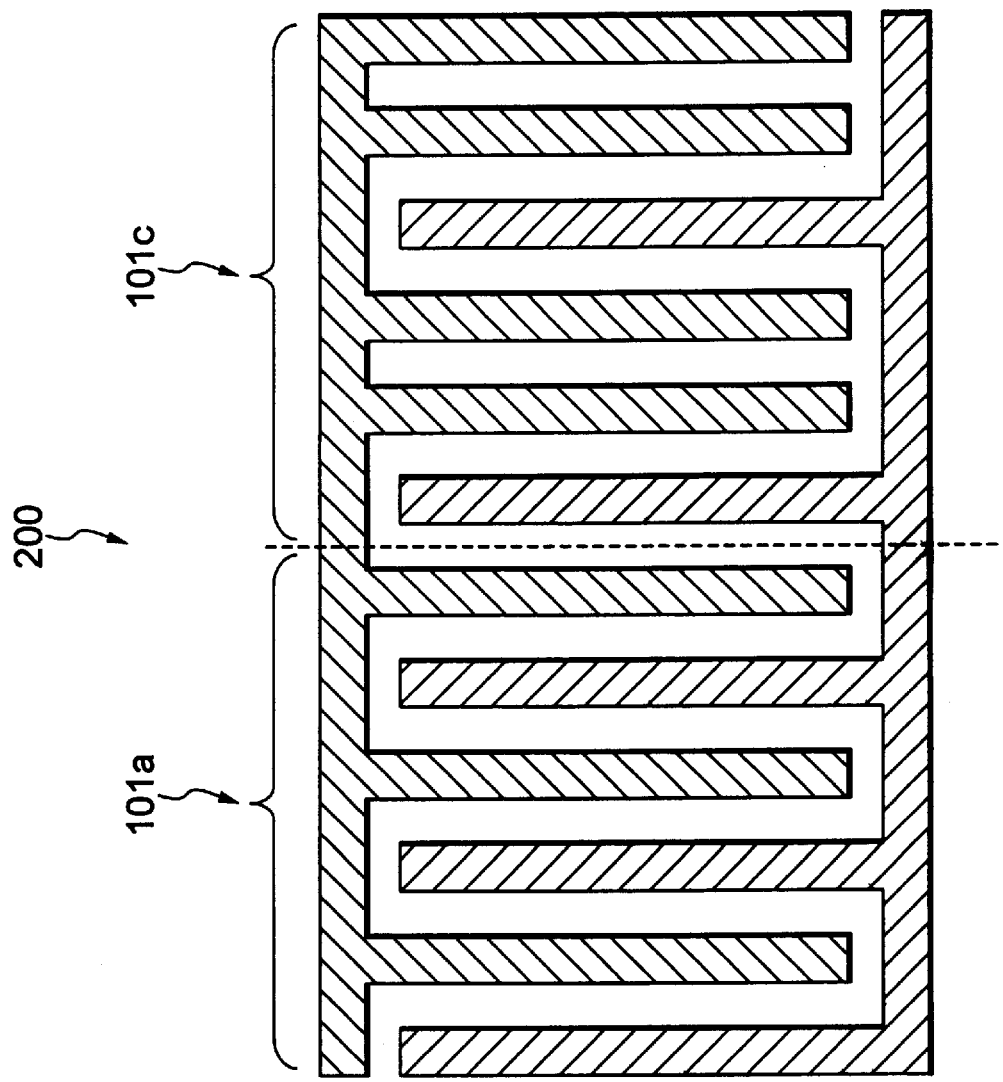
FIG. 32 is a schematic diagram showing a structure of an IDT for describing the present invention.

FIG. 32 is a schematic diagram showing another example of a structure of an IDT that is provided in the surface acoustic wave filter device of the present invention.

The IDT 200 illustrated in FIG. 32 comprises a first area 101a consisting of solid electrode fingers two of which form a unit cycle of polarity, and a second area 101c where odd number of three or more electrode fingers form a unit cycle of polarity.

Figure 33:
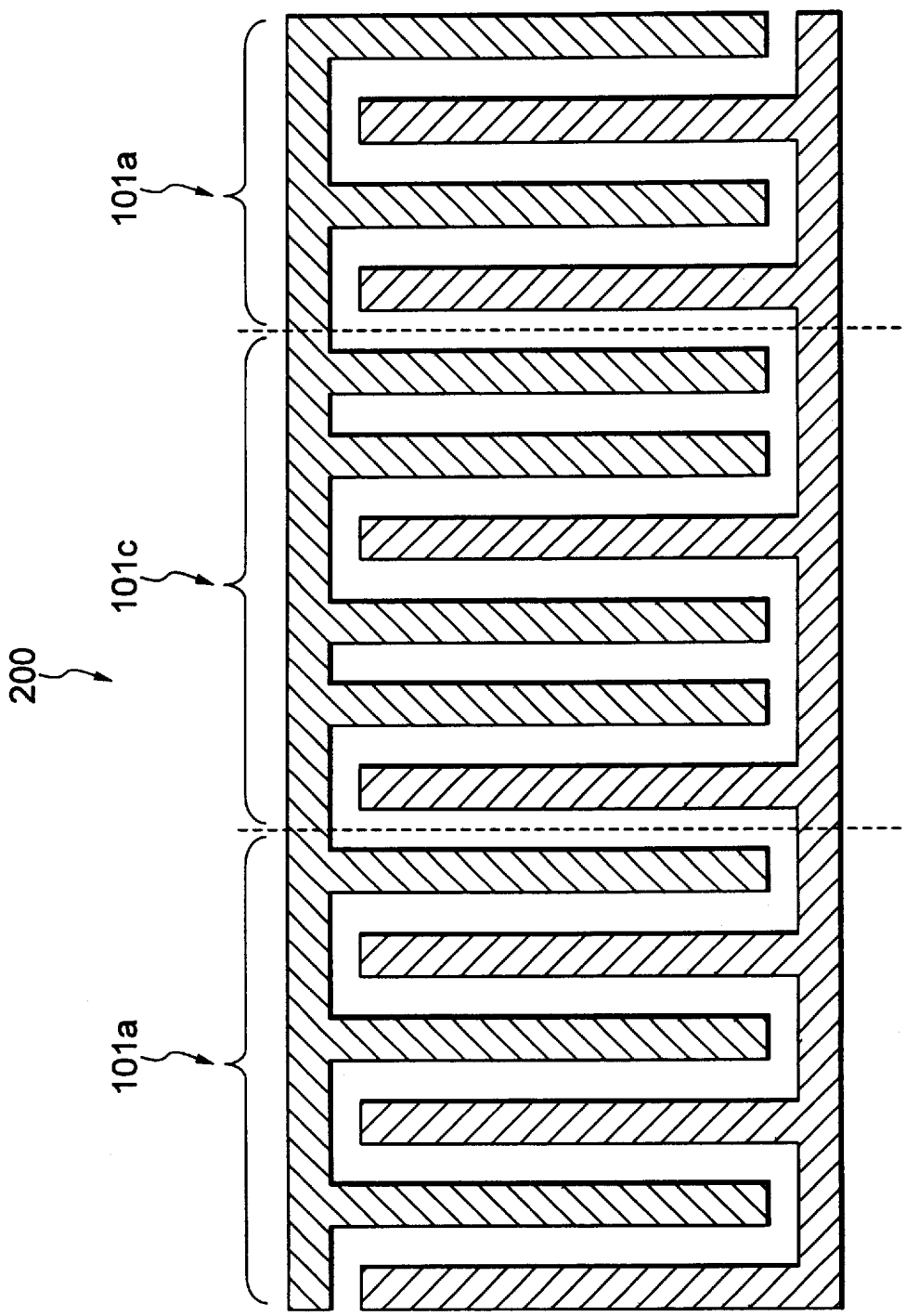
FIG. 33 is a schematic diagram showing a modification example of a structure of an IDT for describing the present invention.
Figure 34:
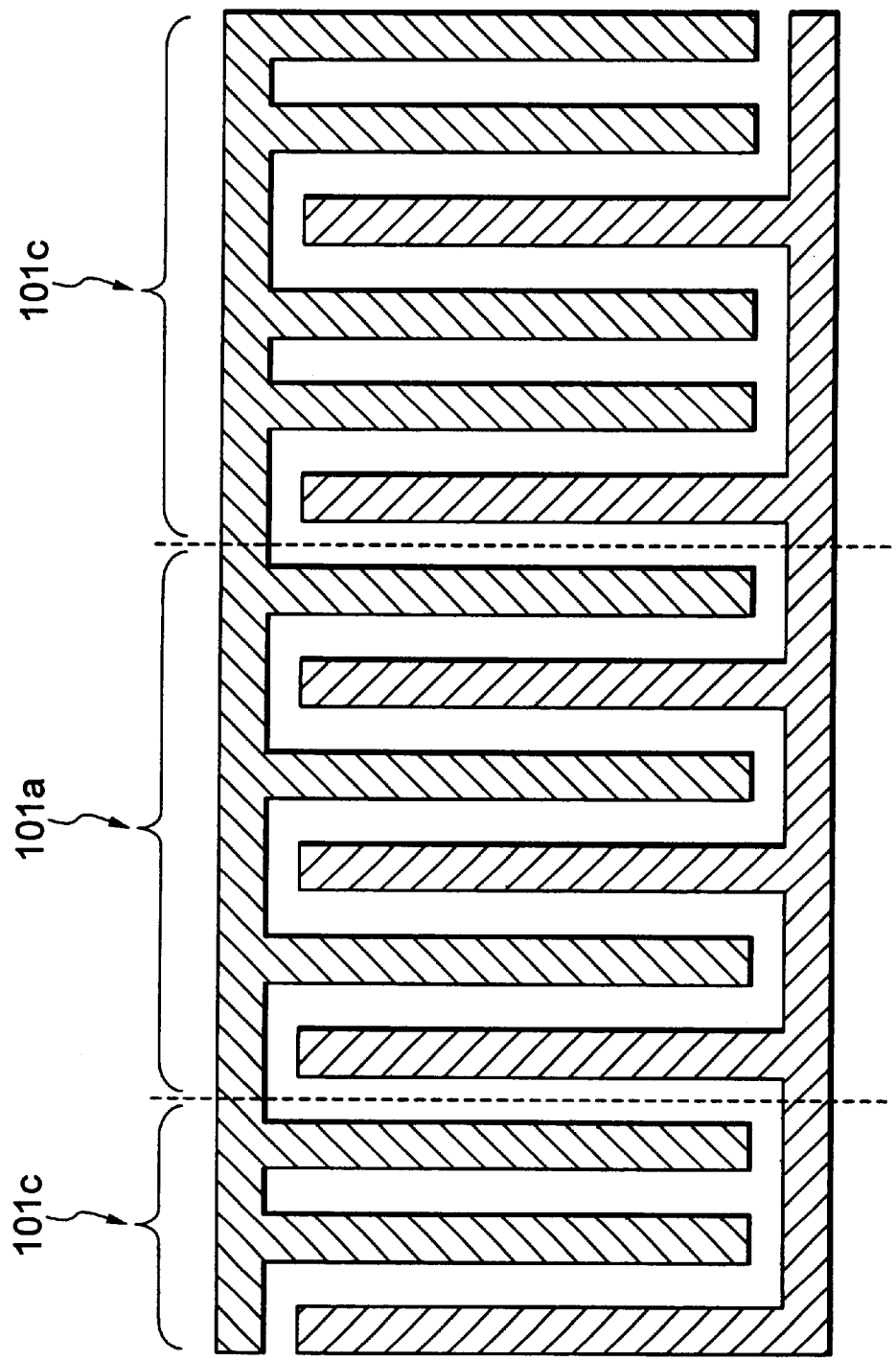
FIG. 34 is a schematic diagram showing a modification example of a structure of an IDT for describing the present invention.

In addition, as illustrated in FIG. 33 and FIG. 34, the first area 101a where two electrode fingers provide a unit cycle or the second area where an odd number of three or more electrode fingers provide a unit cycle may be disposed in multiple number.

In the case of where there are a plurality of IDTs that a surface acoustic wave filter device comprises, at least one IDT can have the first area 101a and the second areas 101b and 101c. Further, as to each IDT 200, as illustrated in, for example, FIG. 32, FIG. 33 and FIG. 34, any one constitution can be employed. That is, all the IDTs that one surface acoustic wave filter device comprises may not be the same structure. Further, a combination with the constitutions such as illustrated in FIG. 23, FIG. 24 and FIG. 25 can be employed.

Figure 35:
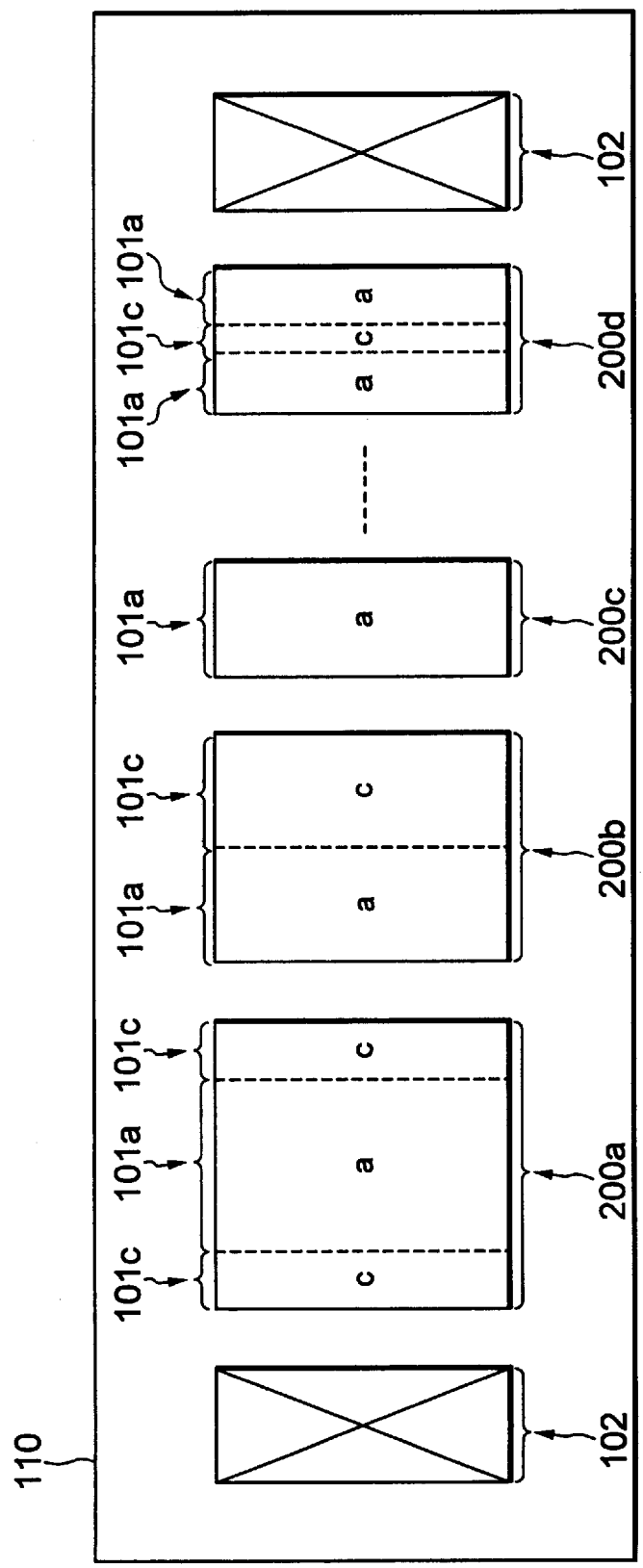
FIG. 35 is a schematic diagram showing an example of a surface acoustic wave filter device for describing the present invention.

FIG. 35 is a schematic diagram showing a constitution of a surface acoustic wave filter device of the present invention. The surface acoustic wave filter device is obtained by forming, on a piezoelectric substrate 110, IDTs 200a, 200b, and 200d consisting of the first area 101a and the second areas 101c as described above and an IDT 200c as prior art solid one between reflectors 102. The phase relationship of the first area 101a and the second area 101c may be in phase or in inverted phase. Thereby also, the characteristics of the surface acoustic wave filter device can be varied.

Further, in the case of where there are a plurality of second areas 101c in one IDT, the phase relationship of the individual second area 101c to the first area 101a may be any one of in phase relation or inverted phase relation. Further the relation in phase and that in inverted phase may be combined.

Figure 36A:
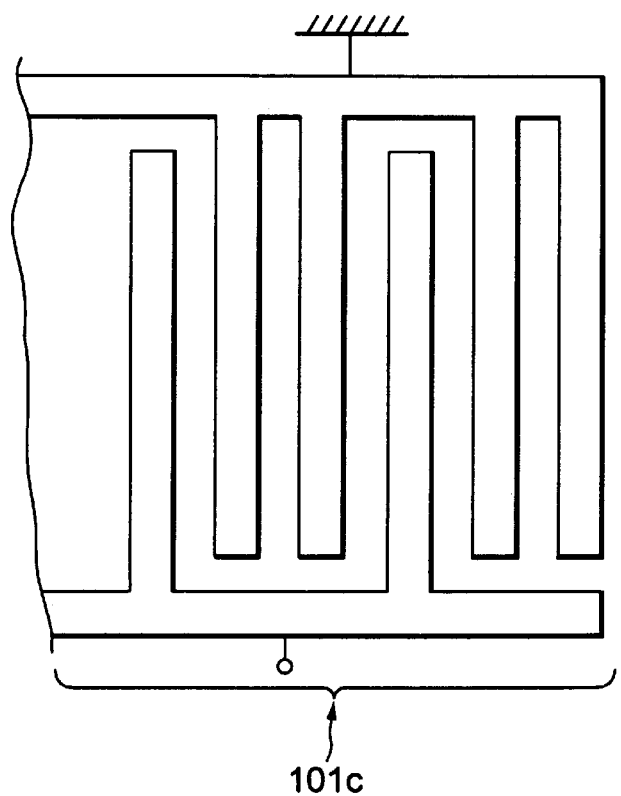
FIG. 36A, FIG. 36B, and FIG. 36C are schematic diagrams showing, for describing the present invention, an example of a constitution of a second area where three electrode fingers forms a unit cycle.
Figure 36B:
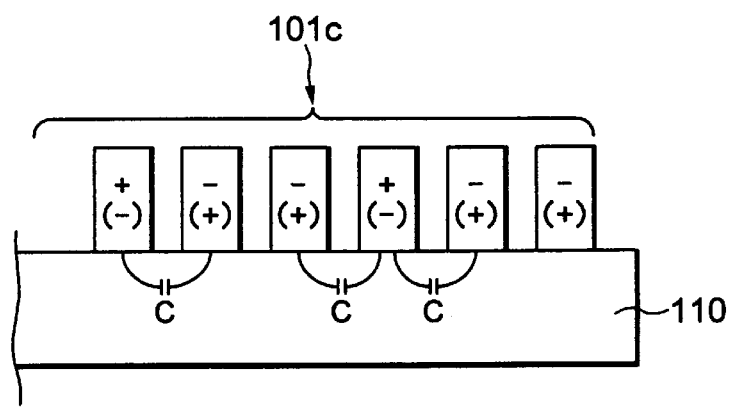
Figure 36C:
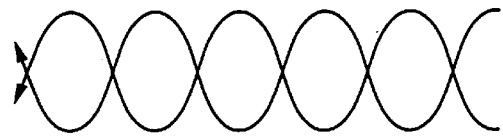

FIG. 36A, FIG. 36B, and FIG. 36C are schematic diagrams describing a structure and operation of the second area 101c, where an odd number of three or more electrode fingers forms a unit cycle of polarity, of the IDT 200 that the surface acoustic wave filter device of the present invention comprises as described above.

When the second area 101c comprises the electrode fingers as shown in FIG. 36A, the cycle of the polarity of the electrode fingers comprises three electrode fingers as shown FIG. 36B upon application of a signal to the IDT. This situation is similar even when the polarity is inverted, and a capacitance is formed at the portion where the polarity of the adjacent electrode fingers is different.

Further, in the second area as shown in FIG. 36C, at a certain signal cycle and the subsequent signal cycle thereof, two kinds of surface acoustic waves that counteract each other are excited, and accordingly the surface acoustic wave is not excited That is, to the surface acoustic wave excited in the first area 101a, the second area 101c behaves as the reflectors having capacitance C.

Figure 37:
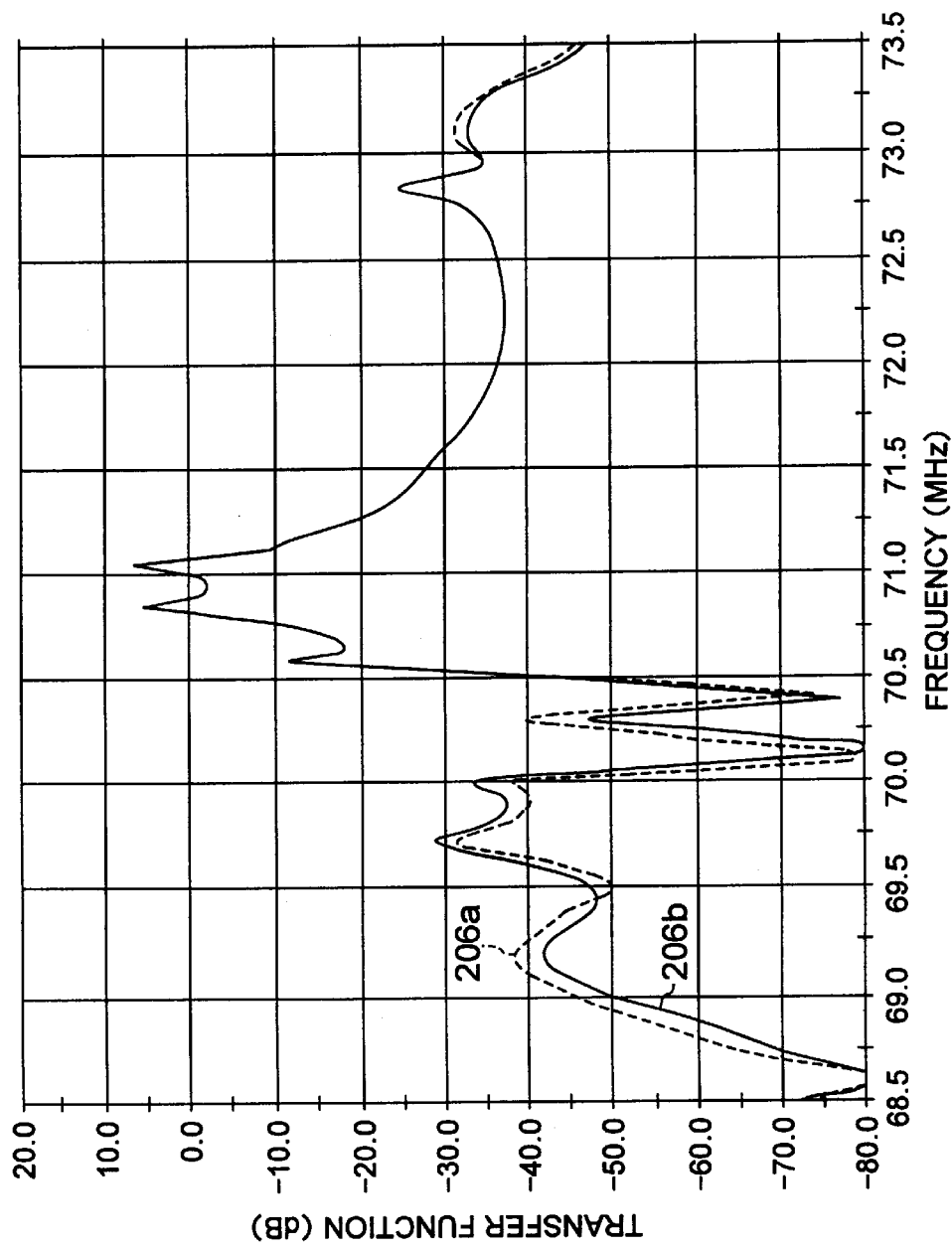
FIG. 37 is a diagram showing results of a simulation of a surface acoustic wave filter device that shows the effect of the present invention.

The present invention is applied to an IF filter for GMS of 71 MHZ that has two IDTs on a 45° X cut LBO substrate. FIG. 37 shows the result of simulation carried out based on an equivalent circuit of Smith on a 50 Ω condition.

The IDT was 44 pairs in terms of a unit cycle of two electrode fingers, the GRs were 50 electrode fingers, and the aperture length was 10λ. In addition, the thickness of the electrode was approximately 1% of the wavelength of the excited surface acoustic wave.

In addition, in this example, the second area 101c where three electrode fingers providing a unit cycle is formed on the GR side of the IDT over 20 cycle equivalent, and there are exciter and reflecting sources. Accordingly, the number of the electrode fingers of the first area 101a of the IDT by the present invention, the number of the electrode fingers that forms an existing IDT to which the present invention is not applied, and the aperture length or the IDT are set equal. With the added number of the electrode fingers of the constitution of the present invention, the number of the electrode fingers of the GRs was decreased.

In FIG. 37, the profile 206a shows the result of simulation due to an existing constitution, and the profile 206b shows the result of simulation of the frequency dependence of the surface acoustic wave filter device according to the present invention.

From these results, it is confirmed that due to the effect of a capacitance added to the IDT that the surface acoustic wave filter device of the present invention comprises, there is only a little difference of characteristics out of band. However the band pass characteristics in the band can be made approximately equal.

Figure 38:
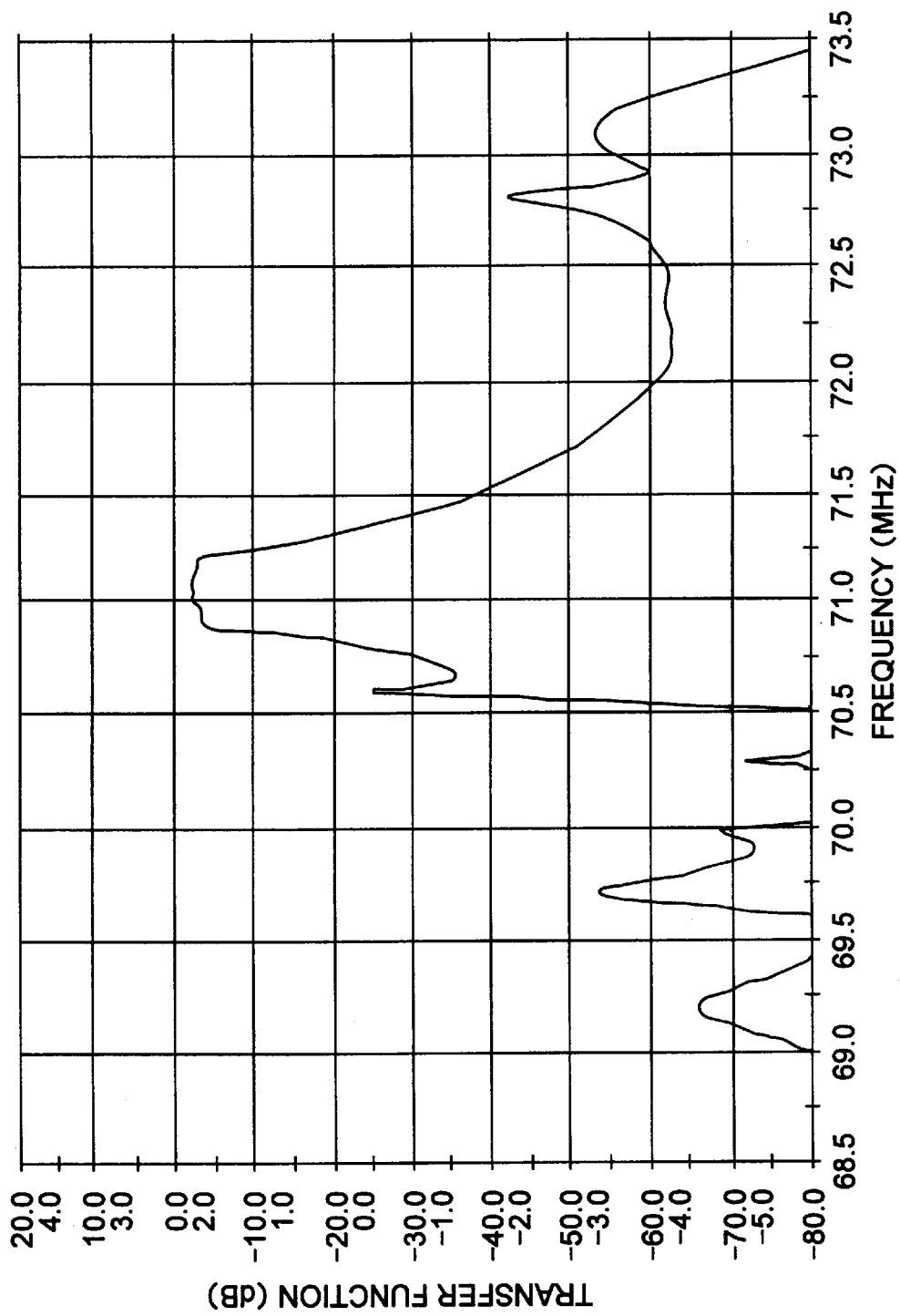
FIG. 38 is a diagram showing the result of a simulation of a surface acoustic wave filter device to which the present invention is applied.
Figure 39:
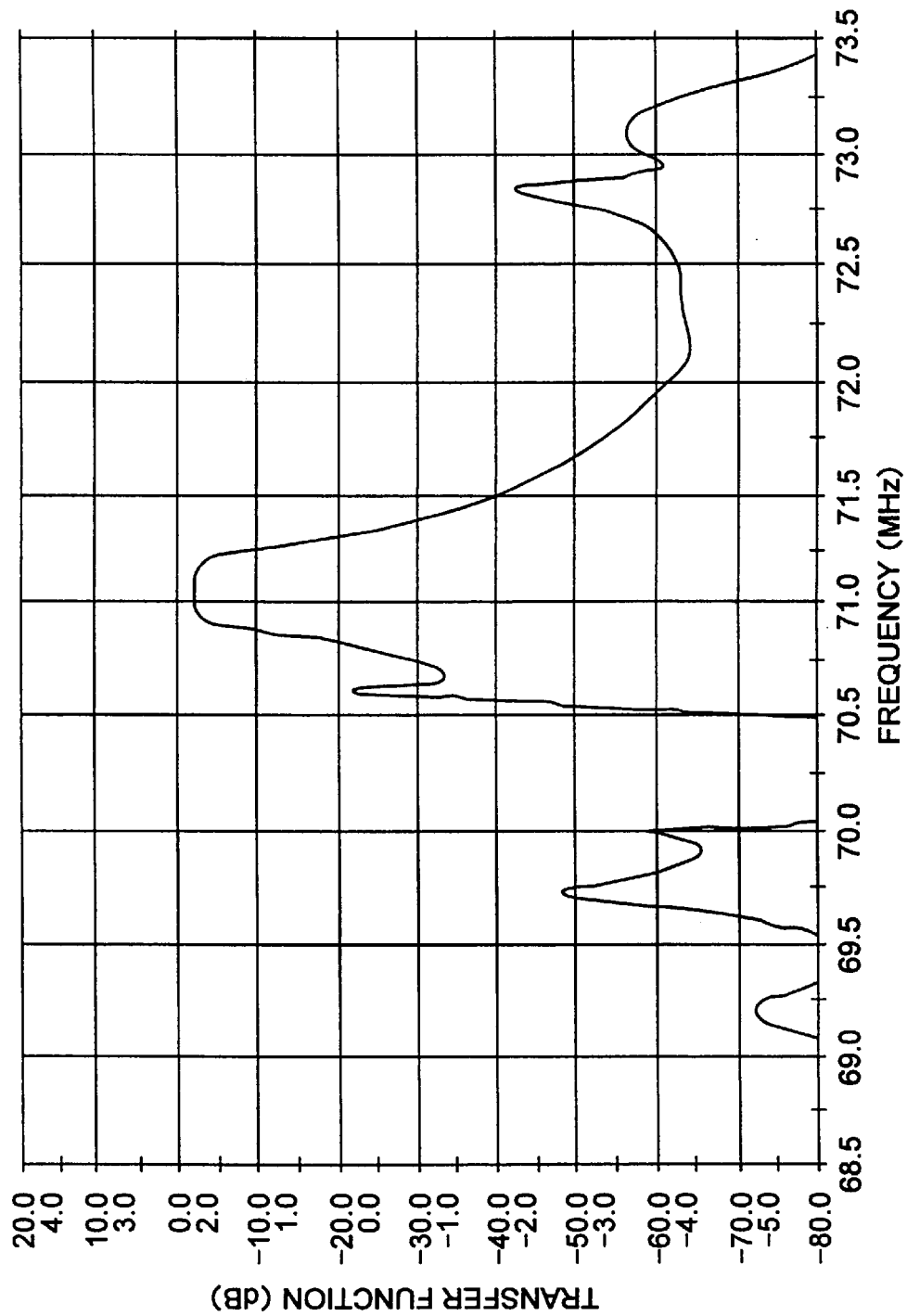
FIG. 39 is a diagram showing the result of a simulation of a surface acoustic wave filter device of an existing structure.
Figure 40:
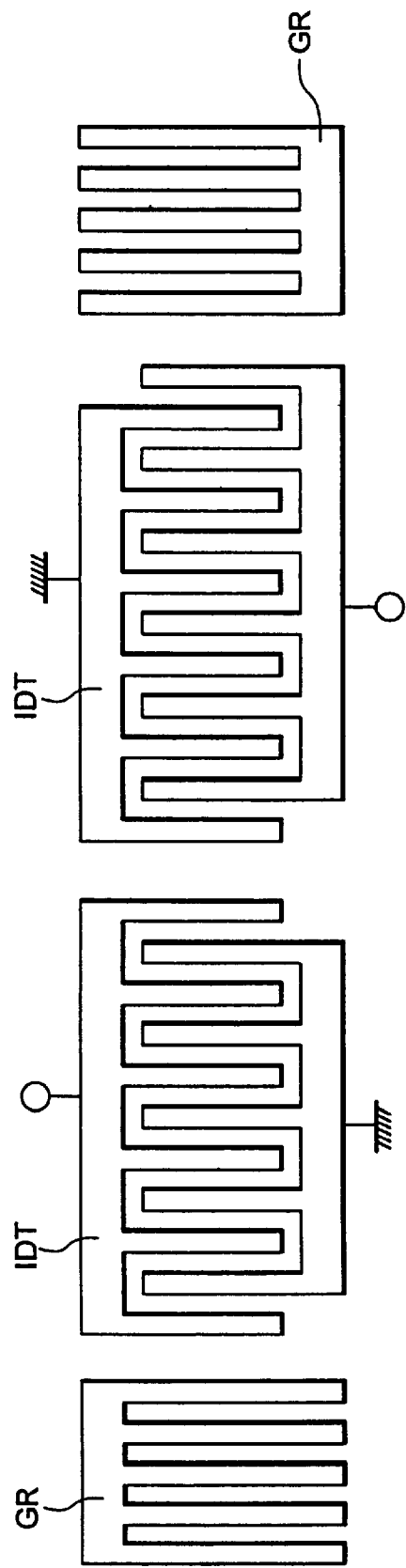
FIG. 40 is a schematic diagram showing a structure of an existing resonant surface acoustic wave filter device.

The surface acoustic wave filter devices of the constitution that showed the profile 206b of FIG. 37 are formed in two stages, and the impedance matched. Under this condition, the simulation is carried out and the result is shown in FIG. 38. Here, the impedance matching was taken with approximately 690 Ω.

The surface acoustic wave filter device of an existing constitution that showed the profile 206a of FIG. 37 are formed in two stages and the impedance matched. Under this condition, the simulation is carried out and the result is shown in FIG. 38. Here, the impedance matching was taken with approximately 870 Ω.

From these simulations, it is confirmed that according to the surface acoustic wave filter device of the present invention, without changing the aperture length of the IDT, the impedance of the surface acoustic wave filter device can be controlled. Thus, according to the present invention, without changing the aperture length of the IDT, the impedance can be controlled.

Further, in this example, IF filters that postulate the use of a tuning circuit that employs the LBO substrate is described. The present invention can be applied to the other piezoelectric substrate and RF filter devices that do not employ a tuning circuit.

What is claimed is:

1. A resonant surface acoustic wave filter device, comprising:

a piezoelectric substrate;

an inter-digital transducer that is formed on the piezoelectric substrate and has a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waves that are excited by the inter-digital transducer, wherein a pitch of an electrode fingers array of the second electrode area of the inter-digital transducer is set approximately equal to a pitch of an electrode fingers array of the first electrode area to make frequency characteristics of a pass band of the filter device flat such that the second surface acoustic wave partially counteracts the first surface acoustic wave.

2. The resonant surface acoustic wave filter device as set forth in claim 1, wherein a plurality of inter-digital transducers is formed between the reflectors.

3. A resonant surface acoustic wave filter device, comprising:

a piezoelectric substrate;

an inter-digital transducer that is formed on the piezoelectric substrate and has a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waves that are excited by the inter-digital transducer, wherein a pitch of an electrode fingers array of the second electrode area of the inter-digital transducer is set larger than a pitch of an electrode fingers array of the first electrode area to increase attenuation at low frequency outside a pass band of the filter device such that the second surface acoustic wave counteracts the first surface acoustic wave.

4. The resonant surface acoustic wave filter device as set forth in claim 3, wherein a plurality of inter-digital transducers is formed between the reflectors.

5. A resonant surface acoustic wave filter device, comprising:

a piezoelectric substrate;

an inter-digital transducer that is formed on the piezoelectric substrate and has a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waves that are excited by the inter-digital transducer, wherein a pitch of an electrode fingers array of the second electrode area of the inter-digital transducer is set smaller than a pitch of an electrode fingers array of the first electrode area to increase attenuation at high frequency outside of a pass band of the filter device such that the second surface acoustic wave counteracts the first surface acoustic wave.

6. The resonant surface acoustic wave filter device as set forth in claim 5, wherein a plurality of inter-digital transducers is formed between the reflectors.

7. A resonant surface acoustic wave filter device comprising:

a piezoelectric substrate; and two or more stages of surface acoustic wave filters having an inter-digital transducer that is formed on the piezoelectric substrate and has a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waves that are excited by the inter-digital transducer, wherein a pitch of an electrode fingers array of the second electrode area of the inter-digital transducer is set approximately equal to a pitch of an electrode fingers array of the first electrode area to make frequency characteristics of a pass band of the filter device flat such that the second surface acoustic wave partially counteracts the first surface acoustic wave, and wherein the surface acoustic wave filters are connected with each other.

8. A resonant surface acoustic wave filter device comprising:

a piezoelectric substrate; and two or more stages of surface acoustic wave filters having an inter-digital transducer that is formed on the piezoelectric substrate and has a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waves that are excited by the inter-digital transducer, wherein a pitch of an electrode fingers array of the second electrode area of the inter-digital transducer is set larger than a pitch of an electrode fingers array of the first electrode area to increase attenuation at low frequency outside a pass band of the filter device such that the second surface acoustic wave counteracts the first surface acoustic wave, and wherein the surface acoustic wave filters are connected with each other.

9. A resonant surface acoustic wave filter device comprising:

a piezoelectric substrate;

a plurality of connected resonant surface acoustic wave filters formed on the piezoelectric substrate, at least one of which has an inter-digital transducer having a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waves that are excited by the inter-digital transducer, wherein a pitch of an electrode fingers array of the second electrode area of the inter-digital transducer is set approximately equal to a pitch of an electrode fingers array of the first electrode area to make frequency characteristics of a pass band of the filter device flat such that the second surface acoustic wave partially counteracts the first surface acoustic wave.

10. A resonant surface acoustic wave filter device, comprising:

a piezoelectric substrate;

a plurality of connected resonant surface acoustic wave filters formed on the piezoelectric substrate, at least one of which has an inter-digital transducer having a first electrode area that excites a first surface acoustic wave and a second electrode area that excites a second surface acoustic wave of inverted phase with respect to the first surface acoustic wave; and grating reflectors formed both sides of the interdigital transducer along a direction of propagation of the first and second surface acoustic waves that are excited by the inter-digital transducer, wherein a pitch of an electrode fingers array of the second electrode area of the inter-digital transducer is set larger than a pitch of an electrode fingers array of the first electrode area to increase attenuation at low frequency outside of a pass band of the filter device such that the second surface acoustic wave counteracts the first surface acoustic wave.

11. A resonant surface acoustic wave filter device, comprising:

a piezoelectric substrate;

a plurality of connected resonant surface acoustic wave filters formed on the piezoelectric substrate, at least one of which has an inter-digital transducer having a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waver that are excited by the inter-digital transducer, wherein a pitch of an electrode fingers array of the second electrode area of the inter-digital transducer is set smaller than a pitch of an electrode fingers array of the first electrode area to increase attenuation at high frequency outside of a pass band of the filter device such that the second surface acoustic wave counteracts the first surface acoustic wave.

12. A resonant surface acoustic wave filter device comprising:

a piezoelectric substrate; and two or more stages of surface acoustic wave filters having an inter-digital transducer that is formed on the piezoelectric substrate and has a first electrode area that excites a first surface acoustic wave and a second electrode area that excites a second surface acoustic wave of inverted phase with respect to the first surface acoustic wave; and grating reflectors formed at both sides of the inter-digital transducer along a direction of propagation of the first and second surface acoustic waves that are excited by the inter-digital transducer, wherein a pitch of an electrode fingers array of the second electrode area of the inter-digital transducer is set smaller than a pitch of an electrode fingers array of the first electrode area to increase attenuation at high frequency outside of a pass band of the filter device such that the second surface acoustic wave counteracts the first surface acoustic wave, and wherein the surface acoustic wave filters are connected with each other.

13. A resonant surface acoustic wave filter device, comprising:
   a piezoelectric substrate;
   a surface acoustic wave filter comprising an inter-digital transducer that has a first area where polarity alternates every adjacent electrode finger and a second area where an alternating arrangement of a first set of plural electrode fingers has one polarity and a second set of electrode fingers comprises at least one having the other polarity,
   wherein a ratio Pb/Pa of an electrode fingers array pitch Pb in the second area to a pitch in the first area Pa is 0.95 or more and 1.05 or less, and the second area of the inter-digital transducer excites two surface acoustic waves that counteract each other.

14. The resonant surface acoustic wave filter device as set forth in claim 13:
   wherein a plurality of surface acoustic wave filters are connected.

15. The resonant surface acoustic wave filter device as set forth in claim 13:
   wherein the second area of the inter-digital transducer works as a reflector that has capacitance between the electrode fingers disposed adjacent having different polarity.

16. The resonant surface acoustic wave filter device as set forth in claim 13:
   wherein the second area of the inter-digital transducer comprises two or more sequence of electrode fingers having same polarity.

17. The resonant surface accustic wave filter device as set forth in claim 13, further comprising:
   grating reflectors formed at both sides of the inter-digital transducer along a direction of propagation of the surface acoustic wave that the inter-digital transducer excites.

18. The resonant surface accostic wave filter device as set forth in claim 17:
   wherein a plurality of the inter-digital transducers are formed between the reflectors.

19. The resonant surface acoustic wave filter device as set forth in claim 13:
   wherein both widths and the pitches of the electrode fingers that the inter-digital transducer comprises are approximately a quarter of a wavelength of the surface acoustic wave that the inter-digital transducer excites.

* * * * *